(12) United States Patent
Bellman et al.

(10) Patent No.: US 11,114,309 B2
(45) Date of Patent: Sep. 7, 2021

(54) ARTICLES AND METHODS OF FORMING VIAS IN SUBSTRATES

(71) Applicant: CORNING INCORPORATED, Corning, NY (US)

(72) Inventors: Robert Alan Bellman, Ithaca, NY (US); Shiwen Liu, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 28 days.

(21) Appl. No.: 16/524,925

(22) Filed: Jul. 29, 2019

(65) Prior Publication Data

US 2019/0348301 A1 Nov. 14, 2019

Related U.S. Application Data

(62) Division of application No. 15/609,238, filed on May 31, 2017, now Pat. No. 10,410,883.

(Continued)

(51) Int. Cl.
*B32B 3/26* (2006.01)
*B32B 33/00* (2006.01)
(Continued)

(52) U.S. Cl.
CPC .............. *H01L 21/486* (2013.01); *B05D 1/60* (2013.01); *B32B 3/26* (2013.01); *B32B 33/00* (2013.01); *C03C 15/00* (2013.01); *C03C 17/22* (2013.01); *C03C 17/30* (2013.01); *C03C 23/0025* (2013.01); *H01L 21/3081* (2013.01); *H01L 21/31144* (2013.01); *H01L 21/6835* (2013.01); *H01L 23/49827* (2013.01);
(Continued)

(58) Field of Classification Search
None
See application file for complete search history.

(56) References Cited

U.S. PATENT DOCUMENTS

| 108,387 A | 10/1870 | Pike |
| 208,387 A | 9/1878 | Geoege |

(Continued)

FOREIGN PATENT DOCUMENTS

| AU | 2004276725 A1 | 4/2005 |
| AU | 2011101310 A4 | 11/2011 |

(Continued)

OTHER PUBLICATIONS

Jaramillo et al., Wet etching of hydrogenated amorphous carbon films, Mar. 7, 2001, Diamond and Related Materials, vol. 10, Issues 3-7, pp. 976-979 (Year: 2001).*

(Continued)

*Primary Examiner* — Jeffrey A Vonch
(74) *Attorney, Agent, or Firm* — Amy T. Lang

(57) ABSTRACT

Methods of forming vias in substrates having at least one damage region extending from a first surface etching the at least one damage region of the substrate to form a via in the substrate, wherein the via extends through the thickness T of the substrate while the first surface of the substrate is masked. The mask is removed from the first surface of the substrate after etching and upon removal of the mask the first surface of the substrate has a surface roughness (Rq) of about less than 1.0 nm.

9 Claims, 4 Drawing Sheets

Related U.S. Application Data

(60) Provisional application No. 62/343,943, filed on Jun. 1, 2016.

(51) Int. Cl.

| | | |
|---|---|---|
| *C03C 15/00* | (2006.01) | |
| *C03C 17/22* | (2006.01) | |
| *C03C 17/30* | (2006.01) | |
| *C03C 23/00* | (2006.01) | |
| *B05D 3/00* | (2006.01) | |
| *B05D 3/06* | (2006.01) | |
| *B05D 3/10* | (2006.01) | |
| *B05D 5/00* | (2006.01) | |
| *H01L 21/48* | (2006.01) | |
| *H01L 21/308* | (2006.01) | |
| *H01L 21/311* | (2006.01) | |
| *B05D 1/00* | (2006.01) | |
| *H01L 21/683* | (2006.01) | |
| *H01L 23/498* | (2006.01) | |
| *H01L 21/768* | (2006.01) | |
| *B23K 103/00* | (2006.01) | |
| *B23K 26/53* | (2014.01) | |
| *B32B 17/06* | (2006.01) | |
| *C03C 3/04* | (2006.01) | |
| *C23C 16/27* | (2006.01) | |

(52) U.S. Cl.
CPC ........ *H01L 23/49838* (2013.01); *B05D 3/007* (2013.01); *B05D 3/06* (2013.01); *B05D 3/10* (2013.01); *B05D 3/107* (2013.01); *B05D 2203/30* (2013.01); *B05D 2203/35* (2013.01); *B23K 26/53* (2015.10); *B23K 2103/50* (2018.08); *B23K 2103/54* (2018.08); *B32B 3/266* (2013.01); *B32B 17/06* (2013.01); *C03C 3/04* (2013.01); *C03C 23/0005* (2013.01); *C03C 2204/08* (2013.01); *C03C 2218/34* (2013.01); *C23C 16/27* (2013.01); *H01L 21/76898* (2013.01); *Y10T 428/24273* (2015.01); *Y10T 428/24322* (2015.01); *Y10T 428/31* (2015.01)

(56) References Cited

U.S. PATENT DOCUMENTS

| | | | |
|---|---|---|---|
| 237,571 A | 2/1881 | Messier | |
| 1,790,397 A | 1/1931 | Woods et al. | |
| 2,682,134 A | 6/1954 | Stanley | |
| 2,749,794 A | 6/1956 | O'Leary | |
| 3,647,410 A | 3/1972 | Heaton et al. | |
| 3,695,497 A | 10/1972 | Dear | |
| 3,695,498 A | 10/1972 | Dear | |
| 3,713,921 A | 1/1973 | Fleischer et al. | |
| 3,729,302 A | 4/1973 | Heaton | |
| 3,775,084 A | 11/1973 | Heaton | |
| 3,798,013 A | 3/1974 | Hasegawa et al. | |
| 4,226,607 A | 10/1980 | Domken | |
| 4,395,271 A | 7/1983 | Beall et al. | |
| 4,441,008 A | 4/1984 | Chan | |
| 4,546,231 A | 10/1985 | Gresser et al. | |
| 4,547,836 A | 10/1985 | Anthony | |
| 4,564,579 A * | 1/1986 | Morita | C08G 77/20 430/270.1 |
| 4,646,308 A | 2/1987 | Kafka et al. | |
| 4,764,930 A | 8/1988 | Bille et al. | |
| 4,891,054 A | 1/1990 | Bricker et al. | |
| 4,907,586 A | 3/1990 | Bille et al. | |
| 4,918,751 A | 4/1990 | Pessot et al. | |
| 4,929,065 A | 5/1990 | Hagerty et al. | |
| 4,948,941 A | 8/1990 | Altman et al. | |
| 5,022,959 A * | 6/1991 | Itoh | H01L 21/3081 216/49 |
| 5,035,918 A | 7/1991 | Vyas | |
| 5,040,182 A | 8/1991 | Spinelli et al. | |
| 5,089,062 A | 2/1992 | Pavlik et al. | |
| 5,102,498 A * | 4/1992 | Itoh | H01L 21/3081 204/192.32 |
| 5,104,210 A | 4/1992 | Tokas | |
| 5,108,857 A | 4/1992 | Kitayama et al. | |
| 5,112,722 A | 5/1992 | Tsujino et al. | |
| 5,114,834 A | 5/1992 | Nachshon | |
| 5,166,493 A | 11/1992 | Inagawa et al. | |
| 5,208,068 A | 5/1993 | Davis et al. | |
| 5,265,107 A | 11/1993 | Delfyett, Jr. | |
| 5,314,522 A | 5/1994 | Kondo et al. | |
| 5,374,291 A | 12/1994 | Yabe et al. | |
| 5,400,350 A | 3/1995 | Galvanauskas | |
| 5,434,875 A | 7/1995 | Rieger et al. | |
| 5,436,925 A | 7/1995 | Lin et al. | |
| 5,457,836 A | 10/1995 | Wiedeck | |
| 5,493,096 A | 2/1996 | Koh | |
| 5,553,093 A | 9/1996 | Ramaswamy et al. | |
| 5,574,597 A | 11/1996 | Kataoka | |
| 5,575,291 A | 11/1996 | Hayakawa et al. | |
| 5,575,936 A | 11/1996 | Goldfarb | |
| 5,586,138 A | 12/1996 | Yokoyama | |
| 5,696,782 A | 12/1997 | Harter et al. | |
| 5,736,709 A | 4/1998 | Neiheisel | |
| 5,745,236 A | 4/1998 | Haga | |
| 5,746,884 A | 5/1998 | Gupta et al. | |
| 5,776,220 A | 7/1998 | Allaire et al. | |
| 5,844,200 A | 11/1998 | Leader et al. | |
| 5,879,424 A | 3/1999 | Nishii et al. | |
| 5,909,284 A | 6/1999 | Nakamura | |
| 5,919,607 A | 7/1999 | Lawandy | |
| 5,933,230 A | 8/1999 | Imaino et al. | |
| 5,965,043 A | 10/1999 | Noddin et al. | |
| 6,016,223 A | 1/2000 | Suzuki et al. | |
| 6,016,324 A | 1/2000 | Rieger et al. | |
| 6,055,829 A | 5/2000 | Witzmann et al. | |
| 6,072,624 A | 6/2000 | Dixon et al. | |
| 6,078,599 A | 6/2000 | Everage et al. | |
| 6,120,131 A | 9/2000 | Murthy et al. | |
| 6,140,243 A * | 10/2000 | Wallace | H01L 21/02063 438/700 |
| 6,143,382 A | 11/2000 | Koyama et al. | |
| 6,156,030 A | 12/2000 | Neev | |
| 6,160,835 A | 12/2000 | Kwon | |
| 6,186,384 B1 | 2/2001 | Sawada | |
| 6,210,401 B1 | 4/2001 | Lai | |
| 6,224,713 B1 | 4/2001 | Hembree et al. | |
| 6,234,755 B1 | 5/2001 | Bunker et al. | |
| 6,256,328 B1 | 7/2001 | Delfyett et al. | |
| 6,259,151 B1 | 7/2001 | Morrison | |
| 6,259,512 B1 | 7/2001 | Mizouchi | |
| 6,272,156 B1 | 8/2001 | Reed et al. | |
| 6,301,932 B1 | 10/2001 | Allen et al. | |
| 6,308,055 B1 | 10/2001 | Welland et al. | |
| 6,319,867 B1 | 11/2001 | Chacon et al. | |
| 6,322,958 B1 | 11/2001 | Hayashi | |
| 6,338,901 B1 * | 1/2002 | Veerasamy | B05D 5/083 428/408 |
| 6,339,208 B1 | 1/2002 | Rockstroh et al. | |
| 6,344,242 B1 | 2/2002 | Stolk et al. | |
| 6,373,565 B1 | 4/2002 | Kafka et al. | |
| 6,381,391 B1 | 4/2002 | Islam et al. | |
| 6,391,213 B1 | 5/2002 | Homola | |
| 6,396,856 B1 | 5/2002 | Sucha et al. | |
| 6,399,914 B1 | 6/2002 | Troitski | |
| 6,407,360 B1 | 6/2002 | Choo et al. | |
| 6,420,088 B1 * | 7/2002 | Angelopoulos | C08G 77/20 430/270.1 |
| 6,438,996 B1 | 8/2002 | Cuvelier | |
| 6,445,491 B2 | 9/2002 | Sucha et al. | |
| 6,449,301 B1 | 9/2002 | Wu et al. | |
| 6,484,052 B1 | 11/2002 | Visuri et al. | |
| 6,489,589 B1 | 12/2002 | Alexander | |
| 6,501,578 B1 | 12/2002 | Bernstein et al. | |
| 6,537,937 B1 | 3/2003 | Nishizawa et al. | |

(56) References Cited

U.S. PATENT DOCUMENTS

| | | | |
|---|---|---|---|
| 6,552,301 | B2 | 4/2003 | Herman et al. |
| 6,563,079 | B1 | 5/2003 | Umetsu et al. |
| 6,573,026 | B1 | 6/2003 | Aitken et al. |
| 6,592,703 | B1 | 7/2003 | Habeck et al. |
| 6,635,849 | B1 | 10/2003 | Okawa et al. |
| 6,635,850 | B2 | 10/2003 | Amako et al. |
| 6,720,519 | B2 | 4/2004 | Liu et al. |
| 6,729,161 | B1 | 5/2004 | Miura et al. |
| 6,737,345 | B1 | 5/2004 | Lin et al. |
| 6,744,009 | B1 | 5/2004 | Kuan et al. |
| 6,754,429 | B2 | 6/2004 | Borrelli et al. |
| 6,787,732 | B1 | 9/2004 | Xuan et al. |
| 6,794,605 | B2 | 9/2004 | Park et al. |
| 6,800,237 | B1 | 10/2004 | Yamamoto et al. |
| 6,800,831 | B1 | 10/2004 | Hoetzel |
| 6,906,795 | B2 | 6/2005 | Goto et al. |
| 6,958,094 | B2 | 10/2005 | Ohmi et al. |
| 6,990,285 | B2 | 1/2006 | Schroeder et al. |
| 6,992,026 | B2 | 1/2006 | Fukuyo et al. |
| 6,992,030 | B2 | 1/2006 | Paulson |
| 7,008,817 | B2 | 3/2006 | Kim et al. |
| 7,009,138 | B2 | 3/2006 | Amako et al. |
| 7,019,257 | B2 | 3/2006 | Stevens |
| 7,033,519 | B2 | 4/2006 | Taylor et al. |
| 7,043,072 | B2 | 5/2006 | Goto et al. |
| 7,057,135 | B2 | 6/2006 | Li |
| 7,084,073 | B2 | 7/2006 | Lee et al. |
| 7,211,899 | B2 | 5/2007 | Taniguchi et al. |
| 7,337,540 | B2 | 3/2008 | Kurosawa |
| 7,353,829 | B1 | 4/2008 | Wachter et al. |
| 7,407,889 | B2 | 8/2008 | Tsunetomo et al. |
| 7,511,886 | B2 | 3/2009 | Schultz et al. |
| 7,528,967 | B2 | 5/2009 | Okawauchi et al. |
| 7,534,734 | B2 | 5/2009 | Ellison |
| 7,535,634 | B1 | 5/2009 | Savchenkov et al. |
| 7,626,665 | B2 | 12/2009 | Koike |
| 7,633,033 | B2 | 12/2009 | Thomas et al. |
| 7,642,483 | B2 | 1/2010 | You et al. |
| 7,649,153 | B2 | 1/2010 | Haight et al. |
| 7,683,370 | B2 | 3/2010 | Kugimiya et al. |
| 7,726,532 | B2 | 5/2010 | Gonoe |
| 7,749,809 | B2 | 7/2010 | How et al. |
| 7,763,559 | B2 | 7/2010 | Kurachi et al. |
| 7,772,115 | B2 | 8/2010 | Hiatt |
| 7,777,275 | B2 | 8/2010 | Lee |
| 7,836,727 | B2 | 11/2010 | Nishiyama |
| 7,880,117 | B2 | 1/2011 | Li et al. |
| 7,981,810 | B1 * | 7/2011 | Subramonium ........ C23C 16/26 438/778 |
| 7,994,503 | B2 | 8/2011 | Hino et al. |
| 8,007,913 | B2 | 8/2011 | Coppola et al. |
| 8,021,950 | B1 | 9/2011 | Abadeer et al. |
| 8,104,385 | B2 | 1/2012 | Hayashi et al. |
| 8,118,971 | B2 | 2/2012 | Hori et al. |
| 8,119,462 | B2 | 2/2012 | Takasawa et al. |
| 8,132,427 | B2 | 3/2012 | Brown et al. |
| 8,163,649 | B2 | 4/2012 | Koike et al. |
| 8,168,514 | B2 | 4/2012 | Garner et al. |
| 8,245,539 | B2 | 8/2012 | Lu et al. |
| 8,245,540 | B2 | 8/2012 | Abramov et al. |
| 8,257,603 | B2 | 9/2012 | Logunov et al. |
| 8,269,138 | B2 | 9/2012 | Garner et al. |
| 8,283,595 | B2 | 10/2012 | Fukuyo et al. |
| 8,292,141 | B2 | 10/2012 | Cox et al. |
| 8,296,066 | B2 | 10/2012 | Zhao et al. |
| 8,303,754 | B2 | 11/2012 | Higuchi |
| 8,307,672 | B2 | 11/2012 | Hidaka et al. |
| 8,327,666 | B2 | 12/2012 | Harvey et al. |
| 8,338,957 | B2 | 12/2012 | Nilsson |
| 8,341,976 | B2 | 1/2013 | Dejneka et al. |
| 8,347,651 | B2 | 1/2013 | Abramov et al. |
| 8,358,888 | B2 | 1/2013 | Ramachandran |
| 8,384,083 | B2 | 2/2013 | Mori et al. |
| 8,411,459 | B2 | 4/2013 | Yu et al. |
| 8,444,906 | B2 | 5/2013 | Lee et al. |
| 8,448,471 | B2 | 5/2013 | Kumatani et al. |
| 8,455,378 | B2 | 6/2013 | Yanase et al. |
| 8,482,189 | B2 | 7/2013 | Goto et al. |
| 8,518,280 | B2 | 8/2013 | Hsu et al. |
| 8,531,679 | B2 | 9/2013 | Scheiner |
| 8,533,942 | B2 | 9/2013 | Ohashi et al. |
| 8,535,997 | B2 | 9/2013 | Kawakami et al. |
| 8,549,881 | B2 | 10/2013 | Brown et al. |
| 8,584,354 | B2 | 11/2013 | Cornejo et al. |
| 8,584,490 | B2 | 11/2013 | Garner et al. |
| 8,592,716 | B2 | 11/2013 | Abramov et al. |
| 8,604,380 | B2 | 12/2013 | Howerton et al. |
| 8,607,590 | B2 | 12/2013 | Glaesemann et al. |
| 8,616,024 | B2 | 12/2013 | Cornejo et al. |
| 8,635,887 | B2 | 1/2014 | Black et al. |
| 8,643,129 | B2 | 2/2014 | Laming et al. |
| 8,670,182 | B2 | 3/2014 | Tanida et al. |
| 8,680,489 | B2 | 3/2014 | Martinez et al. |
| 8,685,838 | B2 | 3/2014 | Fukuyo et al. |
| 8,697,228 | B2 | 4/2014 | Carre |
| 8,699,037 | B2 | 4/2014 | Cox |
| 8,720,228 | B2 | 5/2014 | Li |
| 8,742,588 | B2 | 6/2014 | Nilsson et al. |
| 8,796,165 | B2 | 8/2014 | Ellison et al. |
| 8,826,696 | B2 | 9/2014 | Brown et al. |
| 8,835,335 | B2 | 9/2014 | Murata et al. |
| 8,852,698 | B2 | 10/2014 | Fukumitsu |
| 8,871,641 | B2 | 10/2014 | Nilsson |
| 8,873,067 | B2 | 10/2014 | Lee et al. |
| 8,887,529 | B2 | 11/2014 | Lu et al. |
| 8,916,798 | B2 | 12/2014 | Pluss |
| 8,943,855 | B2 | 2/2015 | Gomez et al. |
| 8,971,053 | B2 | 3/2015 | Kariya et al. |
| 8,980,727 | B1 | 3/2015 | Lei et al. |
| 8,993,465 | B2 | 3/2015 | Ellison et al. |
| 8,999,179 | B2 | 4/2015 | Yu et al. |
| 9,023,421 | B2 | 5/2015 | Nakashima |
| 9,024,443 | B2 | 5/2015 | Inaba et al. |
| 9,093,381 | B2 | 7/2015 | Barriere et al. |
| 9,138,913 | B2 | 9/2015 | Arai et al. |
| 9,140,539 | B2 | 9/2015 | Scheiner |
| 9,227,868 | B2 | 1/2016 | Matsumoto et al. |
| 9,232,652 | B2 | 1/2016 | Fushie et al. |
| 9,263,300 | B2 | 2/2016 | Tsai et al. |
| 9,278,886 | B2 | 3/2016 | Boek et al. |
| 9,285,593 | B1 | 3/2016 | Laskin et al. |
| 9,290,407 | B2 | 3/2016 | Barefoot et al. |
| 9,296,066 | B2 | 3/2016 | Hosseini et al. |
| 9,296,646 | B2 | 3/2016 | Burket et al. |
| 9,305,470 | B2 | 4/2016 | Miki et al. |
| 9,321,680 | B2 | 4/2016 | Chuang et al. |
| 9,324,791 | B2 | 4/2016 | Tamemoto |
| 9,327,381 | B2 | 5/2016 | Lee et al. |
| 9,346,706 | B2 | 5/2016 | Bazemore et al. |
| 9,377,583 | B2 | 6/2016 | Giaretta et al. |
| 9,425,125 | B2 | 8/2016 | Shen |
| 9,442,377 | B1 * | 9/2016 | Ongayi ................... G03F 7/168 |
| 9,446,590 | B2 | 9/2016 | Chen et al. |
| 9,481,598 | B2 | 10/2016 | Bergh et al. |
| 9,517,963 | B2 | 12/2016 | Marjanovic et al. |
| 9,676,046 | B2 | 6/2017 | Hamada et al. |
| 9,745,220 | B2 | 8/2017 | Burket et al. |
| 9,758,876 | B2 | 9/2017 | Shorey et al. |
| 9,760,986 | B2 | 9/2017 | Ramamurthy et al. |
| 9,815,730 | B2 | 11/2017 | Marjanovic et al. |
| 9,832,868 | B1 | 11/2017 | Wright et al. |
| 9,850,160 | B2 | 12/2017 | Marjanovic et al. |
| 9,953,912 | B2 | 4/2018 | Goers |
| 10,144,093 | B2 | 12/2018 | Marjanovic et al. |
| 10,203,476 | B2 | 2/2019 | Cui |
| 2001/0009250 | A1 | 7/2001 | Herman et al. |
| 2002/0005805 | A1 | 1/2002 | Ogura et al. |
| 2002/0041946 | A1 | 4/2002 | Abe |
| 2002/0046997 | A1 | 4/2002 | Nam et al. |
| 2002/0051563 | A1 | 5/2002 | Goto et al. |
| 2002/0052125 | A1 * | 5/2002 | Shaffer, II ........ H01L 21/76813 438/780 |
| 2002/0062563 | A1 | 5/2002 | Koide et al. |
| 2002/0082466 | A1 | 6/2002 | Han |

(56) References Cited

U.S. PATENT DOCUMENTS

| | | |
|---|---|---|
| 2002/0097486 A1 | 7/2002 | Yamaguchi et al. |
| 2002/0110639 A1 | 8/2002 | Bruns |
| 2002/0137344 A1 | 9/2002 | Jordan et al. |
| 2002/0180015 A1 | 12/2002 | Yamaguchi et al. |
| 2002/0182871 A1* | 12/2002 | Lu .................. H01L 21/0337 438/703 |
| 2003/0006221 A1 | 1/2003 | Hong et al. |
| 2003/0007772 A1 | 1/2003 | Borrelli et al. |
| 2003/0045420 A1 | 3/2003 | Koyama et al. |
| 2003/0137056 A1 | 7/2003 | Taniguchi et al. |
| 2003/0150839 A1 | 8/2003 | Kobayashi et al. |
| 2003/0206651 A1 | 11/2003 | Goto et al. |
| 2003/0217568 A1 | 11/2003 | Koyo et al. |
| 2003/0235385 A1 | 12/2003 | Taylor et al. |
| 2004/0000534 A1* | 1/2004 | Lipinski ............ H01L 21/32139 216/58 |
| 2004/0013951 A1 | 1/2004 | Wang |
| 2004/0022487 A1 | 2/2004 | Nagasaka et al. |
| 2004/0058476 A1 | 3/2004 | Enquist et al. |
| 2004/0061705 A1 | 3/2004 | Yoon et al. |
| 2004/0092105 A1 | 5/2004 | Lee et al. |
| 2004/0094524 A1 | 5/2004 | Stevens |
| 2004/0152229 A1 | 8/2004 | Najafi et al. |
| 2004/0188393 A1 | 9/2004 | Li et al. |
| 2004/0217455 A1 | 11/2004 | Shiono et al. |
| 2004/0221615 A1 | 11/2004 | Postupack et al. |
| 2004/0223704 A1 | 11/2004 | Fujii et al. |
| 2004/0256619 A1 | 12/2004 | Nomura et al. |
| 2005/0009315 A1 | 1/2005 | Kim et al. |
| 2005/0023246 A1 | 2/2005 | McEntee et al. |
| 2005/0024743 A1 | 2/2005 | Camy-Peyret |
| 2005/0029238 A1 | 2/2005 | Chen |
| 2005/0033184 A1 | 2/2005 | Christoph |
| 2005/0079650 A1* | 4/2005 | Mancini ................. G03F 7/094 438/105 |
| 2005/0098458 A1 | 5/2005 | Gruetzmacher et al. |
| 2005/0098548 A1 | 5/2005 | Kobayashi et al. |
| 2005/0106874 A1 | 5/2005 | Matsui et al. |
| 2005/0112506 A1* | 5/2005 | Czech ................ H01L 21/3081 430/322 |
| 2005/0115938 A1 | 6/2005 | Sawaki et al. |
| 2005/0142364 A1 | 6/2005 | Aitken |
| 2005/0142812 A1 | 6/2005 | Kurosawa |
| 2005/0158538 A1* | 7/2005 | Li ...................... H01L 21/3081 428/336 |
| 2005/0202683 A1* | 9/2005 | Wang ................ H01L 21/02115 438/763 |
| 2005/0266320 A1* | 12/2005 | Amemiya .................. G03F 1/20 430/5 |
| 2005/0274702 A1 | 12/2005 | Deshi |
| 2006/0011593 A1 | 1/2006 | Fukuyo et al. |
| 2006/0012766 A1 | 1/2006 | Klosner et al. |
| 2006/0019814 A1 | 1/2006 | Baik et al. |
| 2006/0039160 A1 | 2/2006 | Cassarly et al. |
| 2006/0109874 A1 | 5/2006 | Shiozaki et al. |
| 2006/0127679 A1 | 6/2006 | Gulati et al. |
| 2006/0151450 A1 | 7/2006 | You et al. |
| 2006/0192978 A1 | 8/2006 | Laguarta Bertran et al. |
| 2006/0194916 A1* | 8/2006 | Zhong ................. C09D 183/04 524/588 |
| 2006/0207976 A1 | 9/2006 | Bovatsek et al. |
| 2006/0219676 A1 | 10/2006 | Taylor et al. |
| 2006/0227440 A1 | 10/2006 | Gluckstad |
| 2006/0270232 A1 | 11/2006 | Kawamura et al. |
| 2006/0289410 A1 | 12/2006 | Morita et al. |
| 2006/0290232 A1 | 12/2006 | Fujita et al. |
| 2006/0292877 A1 | 12/2006 | Lake |
| 2007/0045779 A1 | 2/2007 | Hiatt |
| 2007/0051706 A1 | 3/2007 | Bovatsek et al. |
| 2007/0111390 A1 | 5/2007 | Komura et al. |
| 2007/0111480 A1 | 5/2007 | Maruyama et al. |
| 2007/0117044 A1* | 5/2007 | Ogihara ................. G03F 7/094 430/270.1 |
| 2007/0119831 A1 | 5/2007 | Kandt |
| 2007/0132977 A1 | 6/2007 | Komatsuda |
| 2007/0138151 A1 | 6/2007 | Tanaka et al. |
| 2007/0177116 A1 | 8/2007 | Amako |
| 2007/0181543 A1 | 8/2007 | Urairi et al. |
| 2007/0190340 A1 | 8/2007 | Coppola et al. |
| 2007/0202619 A1 | 8/2007 | Tamura et al. |
| 2007/0232028 A1 | 10/2007 | Lee et al. |
| 2007/0298529 A1 | 12/2007 | Maeda et al. |
| 2008/0000884 A1 | 1/2008 | Sugiura et al. |
| 2008/0099444 A1 | 4/2008 | Misawa et al. |
| 2008/0194109 A1* | 8/2008 | Ishibashi ............ H01L 21/0338 438/703 |
| 2008/0206690 A1* | 8/2008 | Kennedy .................. G03F 7/11 430/496 |
| 2008/0212185 A1 | 9/2008 | Fuse |
| 2008/0245109 A1 | 10/2008 | Flemming et al. |
| 2008/0314883 A1 | 12/2008 | Juodkazis et al. |
| 2009/0013724 A1 | 1/2009 | Koyo et al. |
| 2009/0029189 A1 | 1/2009 | Moriwaki et al. |
| 2009/0032510 A1 | 2/2009 | Ando et al. |
| 2009/0075087 A1 | 3/2009 | Xu et al. |
| 2009/0098351 A1 | 4/2009 | Kishi |
| 2009/0151996 A1 | 6/2009 | Mishima et al. |
| 2009/0176034 A1 | 7/2009 | Ruuttu et al. |
| 2009/0183764 A1 | 7/2009 | Meyer |
| 2009/0219491 A1 | 9/2009 | Williams et al. |
| 2009/0242528 A1 | 9/2009 | Howerton et al. |
| 2009/0250446 A1 | 10/2009 | Sakamoto |
| 2009/0286091 A1 | 11/2009 | Danielson et al. |
| 2009/0294419 A1 | 12/2009 | Abramov et al. |
| 2009/0294422 A1 | 12/2009 | Lubatschowski et al. |
| 2009/0324899 A1 | 12/2009 | Feinstein et al. |
| 2010/0000259 A1 | 1/2010 | Ukrainczyk et al. |
| 2010/0015439 A1* | 1/2010 | Buether ................ C09D 183/04 428/337 |
| 2010/0015454 A1* | 1/2010 | Anderson ........ B32B 17/10174 428/429 |
| 2010/0025387 A1 | 2/2010 | Arai et al. |
| 2010/0029460 A1 | 2/2010 | Shojiya et al. |
| 2010/0032087 A1 | 2/2010 | Takahashi et al. |
| 2010/0050692 A1 | 3/2010 | Logunov et al. |
| 2010/0068453 A1 | 3/2010 | Imai et al. |
| 2010/0080961 A1 | 3/2010 | Okamura et al. |
| 2010/0086741 A1 | 4/2010 | Bovatsek et al. |
| 2010/0086870 A1* | 4/2010 | Ogihara ................. C08G 77/18 430/270.1 |
| 2010/0089631 A1 | 4/2010 | Sakaguchi et al. |
| 2010/0089882 A1 | 4/2010 | Tamura |
| 2010/0102042 A1 | 4/2010 | Garner et al. |
| 2010/0119808 A1 | 5/2010 | Li et al. |
| 2010/0119846 A1 | 5/2010 | Sawada |
| 2010/0129603 A1 | 5/2010 | Blick et al. |
| 2010/0133697 A1 | 6/2010 | Nilsson |
| 2010/0147813 A1 | 6/2010 | Lei et al. |
| 2010/0178732 A1 | 7/2010 | Wu et al. |
| 2010/0206008 A1 | 8/2010 | Harvey et al. |
| 2010/0252540 A1 | 10/2010 | Lei et al. |
| 2010/0252959 A1 | 10/2010 | Lei et al. |
| 2010/0276505 A1 | 11/2010 | Smith |
| 2010/0279067 A1 | 11/2010 | Sabia et al. |
| 2010/0279509 A1* | 11/2010 | Kim ....................... C08G 77/52 438/706 |
| 2010/0284027 A1 | 11/2010 | Scheiner |
| 2010/0287991 A1 | 11/2010 | Brown et al. |
| 2010/0289115 A1 | 11/2010 | Akiyama et al. |
| 2010/0289186 A1 | 11/2010 | Longo et al. |
| 2010/0291353 A1 | 11/2010 | Dejneka et al. |
| 2010/0292068 A1 | 11/2010 | Takaya et al. |
| 2010/0307809 A1 | 12/2010 | Noda et al. |
| 2010/0320179 A1 | 12/2010 | Morita et al. |
| 2010/0326138 A1 | 12/2010 | Kumatani et al. |
| 2011/0003619 A1 | 1/2011 | Fujii |
| 2011/0032467 A1 | 2/2011 | Koike |
| 2011/0045239 A1* | 2/2011 | Takaya .................... C03B 17/02 428/138 |
| 2011/0049764 A1 | 3/2011 | Lee et al. |
| 2011/0049765 A1 | 3/2011 | Li et al. |
| 2011/0088324 A1 | 4/2011 | Wessel |
| 2011/0100401 A1 | 5/2011 | Fiorentini |

(56) References Cited

U.S. PATENT DOCUMENTS

| | | |
|---|---|---|
| 2011/0123787 A1* | 5/2011 | Tomamoto .............. B32B 17/06 428/212 |
| 2011/0132881 A1 | 6/2011 | Liu |
| 2011/0132883 A1 | 6/2011 | Sheng et al. |
| 2011/0183116 A1 | 7/2011 | Hung et al. |
| 2011/0187025 A1 | 8/2011 | Costin, Sr. |
| 2011/0189847 A1* | 8/2011 | Tsai ......................... G03F 7/20 438/595 |
| 2011/0195360 A1 | 8/2011 | Flemming et al. |
| 2011/0201197 A1 | 8/2011 | Nilsson et al. |
| 2011/0204528 A1* | 8/2011 | Matsutani ............. G03F 7/0233 257/787 |
| 2011/0229687 A1 | 9/2011 | Gu et al. |
| 2011/0240611 A1 | 10/2011 | Sandstroem |
| 2011/0248405 A1 | 10/2011 | Li et al. |
| 2011/0256344 A1 | 10/2011 | Ono et al. |
| 2011/0259373 A1 | 10/2011 | Hotta et al. |
| 2011/0259860 A1 | 10/2011 | Bass et al. |
| 2011/0277507 A1 | 11/2011 | Lu et al. |
| 2011/0300908 A1 | 12/2011 | Grespan et al. |
| 2011/0308942 A1 | 12/2011 | Liu et al. |
| 2011/0316561 A1 | 12/2011 | Tinsley et al. |
| 2011/0318555 A1 | 12/2011 | Bookbinder et al. |
| 2011/0318561 A1 | 12/2011 | Murata et al. |
| 2012/0013196 A1 | 1/2012 | Kim et al. |
| 2012/0017642 A1 | 1/2012 | Teranishi et al. |
| 2012/0047951 A1 | 2/2012 | Dannoux et al. |
| 2012/0047956 A1 | 2/2012 | Li |
| 2012/0050692 A1 | 2/2012 | Gollier |
| 2012/0052302 A1 | 2/2012 | Matusick et al. |
| 2012/0048604 A1 | 3/2012 | Cornejo et al. |
| 2012/0061440 A1 | 3/2012 | Roell |
| 2012/0064306 A1 | 3/2012 | Kang et al. |
| 2012/0092681 A1 | 4/2012 | Cox |
| 2012/0103018 A1 | 5/2012 | Lu et al. |
| 2012/0105095 A1 | 5/2012 | Bryant et al. |
| 2012/0111057 A1 | 5/2012 | Barefoot et al. |
| 2012/0125892 A1 | 5/2012 | Shimoi et al. |
| 2012/0125893 A1 | 5/2012 | Shimoi et al. |
| 2012/0129359 A1 | 5/2012 | Shimoi et al. |
| 2012/0130004 A1* | 5/2012 | Xu ..................... H01L 21/0271 524/509 |
| 2012/0131958 A1 | 5/2012 | Shimoi et al. |
| 2012/0131962 A1 | 5/2012 | Mitsugi et al. |
| 2012/0135177 A1 | 5/2012 | Cornejo et al. |
| 2012/0135195 A1 | 5/2012 | Glaesemann et al. |
| 2012/0135607 A1 | 5/2012 | Shimoi et al. |
| 2012/0135608 A1 | 5/2012 | Shimoi et al. |
| 2012/0135852 A1 | 5/2012 | Ellison et al. |
| 2012/0135853 A1 | 5/2012 | Amin et al. |
| 2012/0141668 A1 | 6/2012 | Nakashima |
| 2012/0142136 A1 | 6/2012 | Horning et al. |
| 2012/0145331 A1 | 6/2012 | Gomez et al. |
| 2012/0168412 A1 | 7/2012 | Hooper |
| 2012/0196071 A1 | 8/2012 | Cornejo et al. |
| 2012/0205356 A1 | 8/2012 | Pluess |
| 2012/0211923 A1 | 8/2012 | Garner et al. |
| 2012/0214006 A1* | 8/2012 | Chen ..................... C09D 183/16 428/447 |
| 2012/0234049 A1 | 9/2012 | Bolton |
| 2012/0234807 A1 | 9/2012 | Sercel et al. |
| 2012/0235969 A1 | 9/2012 | Burns et al. |
| 2012/0241919 A1 | 9/2012 | Mitani |
| 2012/0255935 A1 | 10/2012 | Kakui et al. |
| 2012/0261697 A1 | 10/2012 | Margalit et al. |
| 2012/0276483 A1* | 11/2012 | Ogihara ................ G03F 7/0392 430/319 |
| 2012/0276743 A1* | 11/2012 | Won .................. H01L 27/10817 438/694 |
| 2012/0299203 A1* | 11/2012 | Sugo ........................ C08K 5/09 257/792 |
| 2012/0299219 A1 | 11/2012 | Shimoi et al. |
| 2012/0302139 A1 | 11/2012 | Darcangelo et al. |
| 2012/0308803 A1 | 12/2012 | Dejneka et al. |
| 2013/0019637 A1 | 1/2013 | Sol et al. |
| 2013/0029092 A1 | 1/2013 | Wakioka |
| 2013/0034688 A1 | 2/2013 | Koike et al. |
| 2013/0044371 A1 | 2/2013 | Rupp et al. |
| 2013/0050226 A1 | 2/2013 | Shenoy et al. |
| 2013/0061636 A1 | 3/2013 | Imai et al. |
| 2013/0068736 A1 | 3/2013 | Mielke et al. |
| 2013/0075480 A1 | 3/2013 | Yokogi et al. |
| 2013/0078891 A1 | 3/2013 | Lee et al. |
| 2013/0089701 A1* | 4/2013 | Hooper ................ B23K 26/382 428/131 |
| 2013/0091897 A1 | 4/2013 | Fujii et al. |
| 2013/0105213 A1 | 5/2013 | Hu et al. |
| 2013/0118793 A1 | 5/2013 | Teshima et al. |
| 2013/0122264 A1 | 5/2013 | Fujii et al. |
| 2013/0126573 A1 | 5/2013 | Hosseini et al. |
| 2013/0129947 A1 | 5/2013 | Harvey et al. |
| 2013/0133367 A1 | 5/2013 | Abramov et al. |
| 2013/0135745 A1 | 5/2013 | Tanida et al. |
| 2013/0143416 A1 | 6/2013 | Norval |
| 2013/0149434 A1 | 6/2013 | Oh et al. |
| 2013/0149494 A1 | 6/2013 | Koike et al. |
| 2013/0163801 A1 | 6/2013 | Ha et al. |
| 2013/0167590 A1 | 7/2013 | Teranishi et al. |
| 2013/0174607 A1 | 7/2013 | Wootton et al. |
| 2013/0174610 A1 | 7/2013 | Teranishi et al. |
| 2013/0180285 A1 | 7/2013 | Kariya |
| 2013/0180665 A2 | 7/2013 | Gomez et al. |
| 2013/0189806 A1 | 7/2013 | Hoshino |
| 2013/0192305 A1 | 7/2013 | Black et al. |
| 2013/0205835 A1 | 8/2013 | Giaretta et al. |
| 2013/0209731 A1 | 8/2013 | Nattermann et al. |
| 2013/0210245 A1 | 8/2013 | Jackl |
| 2013/0213467 A1 | 8/2013 | Nattermann et al. |
| 2013/0220982 A1 | 8/2013 | Thomas et al. |
| 2013/0221053 A1 | 8/2013 | Zhang |
| 2013/0224439 A1 | 8/2013 | Zhang et al. |
| 2013/0224492 A1 | 8/2013 | Bookbinder et al. |
| 2013/0228918 A1 | 9/2013 | Chen et al. |
| 2013/0247615 A1 | 9/2013 | Boek et al. |
| 2013/0255779 A1 | 10/2013 | Aitken et al. |
| 2013/0266757 A1 | 10/2013 | Giron et al. |
| 2013/0270240 A1 | 10/2013 | Kondo |
| 2013/0280495 A1 | 10/2013 | Matsumoto |
| 2013/0288010 A1 | 10/2013 | Akarapu et al. |
| 2013/0291598 A1 | 11/2013 | Saito et al. |
| 2013/0312460 A1 | 11/2013 | Kunishi et al. |
| 2013/0323469 A1 | 12/2013 | Abramov et al. |
| 2013/0330515 A1* | 12/2013 | Oh ........................ C03C 17/322 428/156 |
| 2013/0334185 A1 | 12/2013 | Nomaru |
| 2013/0337599 A1 | 12/2013 | Yun |
| 2013/0340480 A1 | 12/2013 | Nattermann et al. |
| 2014/0015121 A1 | 1/2014 | Koizumi et al. |
| 2014/0027951 A1 | 1/2014 | Srinivas et al. |
| 2014/0034374 A1 | 2/2014 | Cornejo et al. |
| 2014/0034730 A1 | 2/2014 | Lee |
| 2014/0042202 A1 | 2/2014 | Lee |
| 2014/0044143 A1 | 2/2014 | Clarkson et al. |
| 2014/0047957 A1 | 2/2014 | Wu |
| 2014/0054618 A1 | 2/2014 | Li |
| 2014/0102146 A1 | 4/2014 | Saito et al. |
| 2014/0110040 A1 | 4/2014 | Cok |
| 2014/0113797 A1 | 4/2014 | Yamada et al. |
| 2014/0116091 A1 | 4/2014 | Chuang et al. |
| 2014/0133119 A1 | 5/2014 | Kariya et al. |
| 2014/0141217 A1 | 5/2014 | Gulati et al. |
| 2014/0147623 A1* | 5/2014 | Shorey .................. C03B 33/102 428/137 |
| 2014/0147624 A1* | 5/2014 | Streltsov ............... B23K 26/082 428/138 |
| 2014/0154439 A1 | 6/2014 | Demartino et al. |
| 2014/0165652 A1 | 6/2014 | Saito |
| 2014/0166199 A1 | 6/2014 | Bellman et al. |
| 2014/0170378 A1* | 6/2014 | Bellman ................. C03C 27/06 428/141 |
| 2014/0174131 A1 | 6/2014 | Saito et al. |
| 2014/0199519 A1 | 7/2014 | Schillinger et al. |
| 2014/0216108 A1 | 8/2014 | Wiegel et al. |

(56) References Cited

U.S. PATENT DOCUMENTS

| | | |
|---|---|---|
| 2014/0231390 A1 | 8/2014 | Nukaga et al. |
| 2014/0235796 A1* | 8/2014 | Ogihara ............... G03F 7/0002 525/389 |
| 2014/0242375 A1 | 8/2014 | Mauro et al. |
| 2014/0254004 A1 | 9/2014 | Wooder et al. |
| 2014/0290310 A1 | 10/2014 | Green |
| 2014/0300728 A1 | 10/2014 | Drescher et al. |
| 2014/0320947 A1 | 10/2014 | Egerton et al. |
| 2014/0333929 A1 | 11/2014 | Sung et al. |
| 2014/0339207 A1 | 11/2014 | Sugiyama et al. |
| 2014/0340730 A1 | 11/2014 | Bergh et al. |
| 2014/0342897 A1 | 11/2014 | Amin et al. |
| 2014/0347083 A1 | 11/2014 | Bryant et al. |
| 2014/0361463 A1 | 12/2014 | Desimone et al. |
| 2014/0376006 A1 | 12/2014 | Scheiner |
| 2015/0021513 A1 | 1/2015 | Kim et al. |
| 2015/0027757 A1 | 1/2015 | Shin et al. |
| 2015/0036065 A1 | 2/2015 | Yousefpor et al. |
| 2015/0037553 A1 | 2/2015 | Mauro |
| 2015/0038313 A1 | 2/2015 | Hosseini |
| 2015/0051060 A1 | 2/2015 | Ellison et al. |
| 2015/0054136 A1 | 2/2015 | Ebefors et al. |
| 2015/0060402 A1* | 3/2015 | Burkett ............... C03C 23/0025 216/41 |
| 2015/0075221 A1 | 3/2015 | Kawaguchi et al. |
| 2015/0075222 A1 | 3/2015 | Mader |
| 2015/0093908 A1* | 4/2015 | Reddy ............... H01L 21/02274 438/758 |
| 2015/0102498 A1 | 4/2015 | Enicks et al. |
| 2015/0110442 A1 | 4/2015 | Zimmel et al. |
| 2015/0118522 A1 | 4/2015 | Hosseini |
| 2015/0136743 A1 | 5/2015 | Hosseini |
| 2015/0140241 A1 | 5/2015 | Hosseini |
| 2015/0140299 A1 | 5/2015 | Ellison et al. |
| 2015/0151380 A1 | 6/2015 | Hosseini |
| 2015/0158120 A1 | 6/2015 | Courvoisier et al. |
| 2015/0165548 A1 | 6/2015 | Marjanovic et al. |
| 2015/0165560 A1 | 6/2015 | Hackert et al. |
| 2015/0165562 A1 | 6/2015 | Marjanovic et al. |
| 2015/0165563 A1 | 6/2015 | Manley et al. |
| 2015/0166391 A1 | 6/2015 | Marjanovic et al. |
| 2015/0166393 A1 | 6/2015 | Marjanovic et al. |
| 2015/0166394 A1 | 6/2015 | Marjanovic et al. |
| 2015/0166395 A1* | 6/2015 | Marjanovic ............ B23K 26/53 428/131 |
| 2015/0166396 A1 | 6/2015 | Marjanovic et al. |
| 2015/0166397 A1 | 6/2015 | Marjanovic et al. |
| 2015/0173191 A1 | 6/2015 | Takahashi |
| 2015/0183679 A1 | 7/2015 | Saito |
| 2015/0232369 A1 | 8/2015 | Marjanovic et al. |
| 2015/0274583 A1 | 10/2015 | An et al. |
| 2015/0299018 A1 | 10/2015 | Bhuyan et al. |
| 2015/0306847 A1* | 10/2015 | Bellman ............... B32B 7/12 428/76 |
| 2015/0329415 A1 | 11/2015 | Bellman et al. |
| 2015/0360991 A1 | 12/2015 | Grundmueller et al. |
| 2015/0367442 A1 | 12/2015 | Bovatsek et al. |
| 2015/0368145 A1 | 12/2015 | Senshu et al. |
| 2015/0376050 A1 | 12/2015 | Nakamura et al. |
| 2016/0008927 A1 | 1/2016 | Grundmueller et al. |
| 2016/0009066 A1 | 1/2016 | Nieber et al. |
| 2016/0023922 A1 | 1/2016 | Addiego et al. |
| 2016/0026842 A1 | 1/2016 | Withers et al. |
| 2016/0031745 A1 | 2/2016 | Ortner et al. |
| 2016/0035587 A1 | 2/2016 | Keech et al. |
| 2016/0059359 A1 | 3/2016 | Krueger et al. |
| 2016/0060156 A1 | 3/2016 | Krueger et al. |
| 2016/0102009 A1 | 4/2016 | Boek et al. |
| 2016/0107925 A1 | 4/2016 | Burket et al. |
| 2016/0145149 A1 | 5/2016 | Burket et al. |
| 2016/0152516 A1 | 6/2016 | Bazemore et al. |
| 2016/0166395 A9 | 6/2016 | Weiman |
| 2016/0199944 A1 | 7/2016 | Hosseini |
| 2016/0200621 A1 | 7/2016 | N'Gom et al. |
| 2016/0201474 A1 | 7/2016 | Slavens et al. |
| 2016/0204126 A1 | 7/2016 | Amano |
| 2016/0208387 A1 | 7/2016 | Liu et al. |
| 2016/0219704 A1 | 7/2016 | Vandemeer et al. |
| 2016/0237571 A1 | 8/2016 | Liu et al. |
| 2016/0280580 A1 | 9/2016 | Bohme |
| 2016/0282584 A1 | 9/2016 | Cui |
| 2016/0289669 A1 | 10/2016 | Fan et al. |
| 2016/0290791 A1 | 10/2016 | Buono et al. |
| 2016/0305764 A1 | 10/2016 | Cui et al. |
| 2016/0311717 A1 | 10/2016 | Nieber et al. |
| 2016/0312365 A1 | 10/2016 | Cordonier et al. |
| 2016/0322291 A1* | 11/2016 | Goers ............... H01L 23/49838 |
| 2016/0327744 A1 | 11/2016 | Giaretta et al. |
| 2016/0334203 A1 | 11/2016 | Cui et al. |
| 2016/0352023 A1 | 11/2016 | Dang et al. |
| 2016/0351410 A1 | 12/2016 | Fu et al. |
| 2016/0362331 A1 | 12/2016 | Castle et al. |
| 2016/0368100 A1 | 12/2016 | Marjanovic et al. |
| 2017/0002601 A1 | 1/2017 | Bergh et al. |
| 2017/0008122 A1 | 1/2017 | Wieland et al. |
| 2017/0011914 A1 | 1/2017 | Sumant et al. |
| 2017/0029957 A1* | 2/2017 | Moon ............... H01L 21/02063 |
| 2017/0036419 A1* | 2/2017 | Adib ............... C03C 27/06 |
| 2017/0103249 A1 | 4/2017 | Jin et al. |
| 2017/0119891 A1 | 5/2017 | Lal et al. |
| 2017/0160077 A1 | 6/2017 | Featherstone et al. |
| 2017/0169847 A1 | 6/2017 | Tamaki |
| 2017/0228884 A1 | 8/2017 | Yoshida |
| 2017/0252859 A1 | 9/2017 | Kumkar et al. |
| 2017/0276951 A1 | 9/2017 | Kumkar et al. |
| 2017/0358447 A1 | 12/2017 | Tsunetomo et al. |
| 2017/0363417 A1 | 12/2017 | Cui et al. |
| 2017/0372899 A1* | 12/2017 | Yang ............... C23C 16/26 |
| 2018/0005922 A1 | 1/2018 | Levesque et al. |
| 2018/0033128 A1 | 1/2018 | Sobieranski et al. |
| 2018/0057390 A1 | 3/2018 | Hackert et al. |
| 2018/0062342 A1 | 3/2018 | Comstock, II et al. |
| 2018/0068868 A1 | 3/2018 | Jaramillo et al. |
| 2018/0093914 A1 | 4/2018 | Akarapu et al. |
| 2018/0215647 A1 | 8/2018 | Ortner et al. |
| 2018/0340262 A1 | 11/2018 | Hiranuma |
| 2018/0342450 A1 | 11/2018 | Huang et al. |
| 2018/0342451 A1 | 11/2018 | Dahlberg et al. |
| 2019/0012514 A1* | 1/2019 | Jin ............... C03C 17/3668 |
| 2019/0185373 A1 | 6/2019 | Hu et al. |
| 2020/0156990 A1 | 5/2020 | Sakade et al. |

FOREIGN PATENT DOCUMENTS

| | | |
|---|---|---|
| CA | 2530607 A1 | 4/2005 |
| CN | 1096936 A | 1/1995 |
| CN | 1196562 A | 10/1998 |
| CN | 2388062 Y | 7/2000 |
| CN | 1473087 A | 2/2004 |
| CN | 1485812 A | 3/2004 |
| CN | 1200793 C | 5/2005 |
| CN | 1619778 A | 5/2005 |
| CN | 1636912 A | 7/2005 |
| CN | 1735568 A | 2/2006 |
| CN | 1761378 A | 4/2006 |
| CN | 1845812 A | 10/2006 |
| CN | 1283409 C | 11/2006 |
| CN | 1967815 A | 5/2007 |
| CN | 101048255 A | 10/2007 |
| CN | 101238572 A | 8/2008 |
| CN | 101386466 A | 3/2009 |
| CN | 101427427 A | 5/2009 |
| CN | 100494879 C | 6/2009 |
| CN | 101502914 A | 8/2009 |
| CN | 100546004 C | 9/2009 |
| CN | 100555601 C | 10/2009 |
| CN | 101602148 A | 12/2009 |
| CN | 101610870 A | 12/2009 |
| CN | 201357287 Y | 12/2009 |
| CN | 101631739 A | 1/2010 |
| CN | 101637849 A | 2/2010 |
| CN | 201471092 U | 5/2010 |
| CN | 101722367 A | 6/2010 |

(56) References Cited

FOREIGN PATENT DOCUMENTS

| | | | |
|---|---|---|---|
| CN | 101862907 A | 10/2010 | |
| CN | 101965242 A | 2/2011 | |
| CN | 102046545 A | 5/2011 | |
| CN | 102060437 A | 5/2011 | |
| CN | 102246292 A | 11/2011 | |
| CN | 102300820 A | 12/2011 | |
| CN | 102304323 A * | 1/2012 | |
| CN | 102319960 A | 1/2012 | |
| CN | 102326232 A | 1/2012 | |
| CN | 102343631 A | 2/2012 | |
| CN | 102356049 A | 2/2012 | |
| CN | 102356050 A | 2/2012 | |
| CN | 102428047 A | 4/2012 | |
| CN | 102485405 A | 6/2012 | |
| CN | 102540474 A | 7/2012 | |
| CN | 102574246 A | 7/2012 | |
| CN | 102585696 A * | 7/2012 | |
| CN | 102596830 A | 7/2012 | |
| CN | 102649199 A | 8/2012 | |
| CN | 102672355 A | 9/2012 | |
| CN | 102795596 A | 11/2012 | |
| CN | 102898014 A | 1/2013 | |
| CN | 102916081 A | 2/2013 | |
| CN | 102923939 A | 2/2013 | |
| CN | 102958642 A | 3/2013 | |
| CN | 103013374 A | 4/2013 | |
| CN | 103079747 A | 4/2013 | |
| CN | 103143841 A | 6/2013 | |
| CN | 103159401 A | 6/2013 | |
| CN | 203021443 U | 6/2013 | |
| CN | 103237771 A | 8/2013 | |
| CN | 103273195 A | 9/2013 | |
| CN | 103316990 A | 9/2013 | |
| CN | 103359947 A | 10/2013 | |
| CN | 103359948 A | 10/2013 | |
| CN | 103460368 A | 12/2013 | |
| CN | 103531414 A | 1/2014 | |
| CN | 103534216 A | 1/2014 | |
| CN | 103746027 A | 4/2014 | |
| CN | 203509350 U | 4/2014 | |
| CN | 104344202 A | 2/2015 | |
| CN | 104897062 A | 9/2015 | |
| CN | 105246850 A | 1/2016 | |
| CN | 105392593 A | 3/2016 | |
| CN | 105693102 A * | 6/2016 | |
| CN | 106132627 A | 11/2016 | |
| CN | 108191258 A * | 6/2018 | |
| DE | 2231330 A1 | 1/1974 | |
| DE | 10322376 A1 | 12/2004 | |
| DE | 102006035555 A1 | 1/2008 | |
| DE | 102010003817 A1 | 10/2011 | |
| DE | 102011000768 A1 | 8/2012 | |
| DE | 102012010635 A1 | 11/2013 | |
| DE | 102012110971 A1 | 5/2014 | |
| DE | 102013103370 A1 | 10/2014 | |
| DE | 102013223637 A1 | 5/2015 | |
| DE | 102014113339 A1 | 3/2016 | |
| EP | 247993 A1 | 12/1987 | |
| EP | 0270897 A1 | 6/1988 | |
| EP | 280918 A2 | 9/1988 | |
| EP | 0393381 A2 | 10/1990 | |
| EP | 0938946 A1 | 8/1999 | |
| EP | 1043110 A2 | 10/2000 | |
| EP | 1159104 A1 | 12/2001 | |
| EP | 1164113 A1 | 12/2001 | |
| EP | 1412131 A1 | 4/2004 | |
| EP | 1449810 A2 | 8/2004 | |
| EP | 1609559 A1 | 12/2005 | |
| EP | 1614665 A1 | 1/2006 | |
| EP | 1651943 A2 | 5/2006 | |
| EP | 1714730 A1 | 10/2006 | |
| EP | 1990125 A1 | 11/2008 | |
| EP | 2020273 A1 | 2/2009 | |
| EP | 2133170 A1 | 12/2009 | |
| EP | 2202545 A1 | 6/2010 | |
| EP | 2253414 A1 | 11/2010 | |
| EP | 2398746 A1 | 12/2011 | |
| EP | 2543065 A1 | 1/2013 | |
| EP | 2574983 A1 | 4/2013 | |
| EP | 2600397 A1 | 6/2013 | |
| EP | 2754524 A1 | 7/2014 | |
| EP | 2781296 A1 | 9/2014 | |
| EP | 2783784 A2 | 9/2014 | |
| EP | 2831913 A1 | 2/2015 | |
| EP | 2859984 A2 | 4/2015 | |
| EP | 2922793 A1 | 9/2015 | |
| EP | 3166372 A1 | 5/2017 | |
| EP | 3288906 A1 | 3/2018 | |
| FR | 2989294 A1 | 10/2013 | |
| GB | 1242172 A | 8/1971 | |
| GB | 2481190 A | 12/2011 | |
| IN | 201102390 | 2/2013 | |
| JP | 55-130839 A | 10/1980 | |
| JP | 56129261 A * | 10/1981 | ............ C03C 17/30 |
| JP | 56-160893 A | 12/1981 | |
| JP | 60220340 A * | 11/1985 | ........... G03F 7/0757 |
| JP | 64-077001 A | 3/1989 | |
| JP | 01-179770 A | 7/1989 | |
| JP | 03-252384 A | 11/1991 | |
| JP | 04-349132 A | 12/1992 | |
| JP | 06-079486 A | 3/1994 | |
| JP | 06-318756 A | 11/1994 | |
| JP | 09-106243 A | 4/1997 | |
| JP | 10-263873 A | 10/1998 | |
| JP | 11-197498 A | 7/1999 | |
| JP | 11-269683 A | 10/1999 | |
| JP | 11-297703 A | 10/1999 | |
| JP | 11-330597 A | 11/1999 | |
| JP | 11-347758 A | 12/1999 | |
| JP | 2000010289 A * | 1/2000 | |
| JP | 2000-301372 A | 10/2000 | |
| JP | 2000-302488 A | 10/2000 | |
| JP | 2001-105398 A | 4/2001 | |
| JP | 2001106545 A | 4/2001 | |
| JP | 2001-138083 A | 5/2001 | |
| JP | 2002-028799 A | 1/2002 | |
| JP | 2002-154846 A | 5/2002 | |
| JP | 2002-210730 A | 7/2002 | |
| JP | 2002-228818 A | 8/2002 | |
| JP | 2003-017503 A | 1/2003 | |
| JP | 2003-062756 A | 3/2003 | |
| JP | 2003-114400 A | 4/2003 | |
| JP | 2003-154517 A | 5/2003 | |
| JP | 2003148931 A | 5/2003 | |
| JP | 2003-181668 A | 7/2003 | |
| JP | 2003-238178 A | 8/2003 | |
| JP | 2004-190043 A | 7/2004 | |
| JP | 2004-209675 A | 7/2004 | |
| JP | 2004-255562 A | 9/2004 | |
| JP | 2004-330236 A | 11/2004 | |
| JP | 2004-351494 A | 12/2004 | |
| JP | 2004363212 A | 12/2004 | |
| JP | 2005-000952 A | 1/2005 | |
| JP | 2005019576 A | 1/2005 | |
| JP | 2005-074663 A | 3/2005 | |
| JP | 2005-104819 A | 4/2005 | |
| JP | 2005-205440 A | 8/2005 | |
| JP | 2005257339 A | 9/2005 | |
| JP | 2005-279755 A | 10/2005 | |
| JP | 2005-288503 A | 10/2005 | |
| JP | 2005-306702 A | 11/2005 | |
| JP | 2006-130691 A | 5/2006 | |
| JP | 3775250 B2 | 5/2006 | |
| JP | 3775410 B2 | 5/2006 | |
| JP | 2006-161124 A | 6/2006 | |
| JP | 2006-248885 A | 9/2006 | |
| JP | 3823108 B2 | 9/2006 | |
| JP | 2006-290630 A | 10/2006 | |
| JP | 2007-021548 A | 1/2007 | |
| JP | 2007-042741 A | 2/2007 | |
| JP | 2007-067031 A | 3/2007 | |
| JP | 2007-196277 A | 8/2007 | |
| JP | 2007-253203 A | 10/2007 | |
| JP | 2007-260896 A | 10/2007 | |

(56) References Cited

FOREIGN PATENT DOCUMENTS

| | | | |
|---|---|---|---|
| JP | 2008094641 A * | 4/2008 |
| JP | 2008-156200 A | 7/2008 |
| JP | 2008-522950 A | 7/2008 |
| JP | 2008-247639 A | 10/2008 |
| JP | 2008273783 A * | 11/2008 |
| JP | 2008288577 A | 11/2008 |
| JP | 4349132 B2 | 10/2009 |
| JP | 4418282 B2 | 2/2010 |
| JP | 2010-046761 A | 3/2010 |
| JP | 2010074017 A | 4/2010 |
| JP | 2010-539288 A | 12/2010 |
| JP | 4592855 B2 | 12/2010 |
| JP | 2011-011212 A | 1/2011 |
| JP | 2011-037707 A | 2/2011 |
| JP | 2011-049398 A | 3/2011 |
| JP | 4672689 B2 | 4/2011 |
| JP | 2011-517299 A | 6/2011 |
| JP | 2011-143434 A | 7/2011 |
| JP | 2011178642 A | 9/2011 |
| JP | 2011-228517 A | 11/2011 |
| JP | 2011-251872 A | 12/2011 |
| JP | 2012-024782 A | 2/2012 |
| JP | 2012-028533 A | 2/2012 |
| JP | 2012-031018 A | 2/2012 |
| JP | 4880820 B2 | 2/2012 |
| JP | 2012-506837 | 3/2012 |
| JP | 2012-159749 A | 8/2012 |
| JP | 2012-517957 A | 8/2012 |
| JP | 2012-187618 A | 10/2012 |
| JP | 2013-007842 A | 1/2013 |
| JP | 2013-031879 A | 2/2013 |
| JP | 2013-043808 A | 3/2013 |
| JP | 2013-075802 A | 4/2013 |
| JP | 2013-091578 A | 5/2013 |
| JP | 2013-121908 A | 6/2013 |
| JP | 5274085 B2 | 8/2013 |
| JP | 2013-178371 A | 9/2013 |
| JP | 2013-187247 A | 9/2013 |
| JP | 2013-536081 A | 9/2013 |
| JP | 5300544 B2 | 9/2013 |
| JP | 2013-203630 A | 10/2013 |
| JP | 2013-203631 A | 10/2013 |
| JP | 2013-223886 A | 10/2013 |
| JP | 5318748 B2 | 10/2013 |
| JP | 2013220958 A | 10/2013 |
| JP | 2013-245153 A | 12/2013 |
| JP | 2015-501531 A | 1/2015 |
| JP | 2015-030040 A | 2/2015 |
| JP | 2015-129076 A | 7/2015 |
| JP | 2015-519722 A | 7/2015 |
| JP | 2015146410 A | 8/2015 |
| JP | 2016-508069 A | 3/2016 |
| KR | 10-2002-0038707 A | 5/2002 |
| KR | 20020066005 A * | 8/2002 |
| KR | 10-2009-0057161 A | 6/2009 |
| KR | 2010-0120297 A | 11/2010 |
| KR | 10-1020621 B1 | 3/2011 |
| KR | 2011-0046953 A | 5/2011 |
| KR | 2011-0121637 A | 11/2011 |
| KR | 10-2012-0015366 A | 2/2012 |
| KR | 10-1120471 B1 | 3/2012 |
| KR | 10-1159697 B1 | 6/2012 |
| KR | 10-2012-0074508 A | 7/2012 |
| KR | 2012-0102675 A | 9/2012 |
| KR | 2013-0031380 A | 3/2013 |
| KR | 10-1259349 B1 | 4/2013 |
| KR | 10-1269474 B1 | 5/2013 |
| KR | 2013-0079395 A | 7/2013 |
| KR | 10-2013-0111269 A | 10/2013 |
| KR | 10-2013-0124646 A | 11/2013 |
| KR | 10-1344368 B1 | 12/2013 |
| KR | 10-2014-0022980 A | 2/2014 |
| KR | 10-2014-0022981 A | 2/2014 |
| KR | 10-2014-0064220 A | 5/2014 |
| KR | 10-1423338 B1 | 7/2014 |
| KR | 10-2014-0112652 A | 9/2014 |
| KR | 2015-0016176 A | 2/2015 |
| TW | 200842313 | 11/2008 |
| TW | 201027601 A | 7/2010 |
| TW | 201041027 A | 11/2010 |
| TW | 201041118 A | 11/2010 |
| TW | 201212755 A | 3/2012 |
| TW | 201226345 A | 6/2012 |
| TW | 201303259 A | 1/2013 |
| TW | 201311592 A | 3/2013 |
| TW | 201331136 A | 7/2013 |
| TW | 201339111 A | 9/2013 |
| TW | 201429897 A | 8/2014 |
| TW | 201610602 A | 3/2016 |
| TW | 201621267 A | 6/2016 |
| WO | 89/02877 A1 | 4/1989 |
| WO | 98/21154 A1 | 5/1998 |
| WO | 99/29243 A1 | 6/1999 |
| WO | 99/63900 A1 | 12/1999 |
| WO | 00/51778 A1 | 9/2000 |
| WO | 01/33621 A2 | 5/2001 |
| WO | 2002/081142 A1 | 10/2002 |
| WO | 2003/007370 A1 | 1/2003 |
| WO | 03/11522 A1 | 2/2003 |
| WO | 03021004 A1 | 3/2003 |
| WO | 2004/110693 A1 | 12/2004 |
| WO | 2005/031300 A2 | 4/2005 |
| WO | 2005/033033 A1 | 4/2005 |
| WO | 2005/034594 A1 | 4/2005 |
| WO | 2006/073098 A1 | 7/2006 |
| WO | 2006/112822 A1 | 10/2006 |
| WO | 2007/094160 A1 | 8/2007 |
| WO | 2007/094233 A1 | 8/2007 |
| WO | 2007/096958 A1 | 8/2007 |
| WO | 2008/012186 A1 | 1/2008 |
| WO | 2008/080182 A1 | 7/2008 |
| WO | 2008/102848 A1 | 8/2008 |
| WO | 2008110061 A1 | 9/2008 |
| WO | 2008/128612 A1 | 10/2008 |
| WO | 2009/072810 A2 | 6/2009 |
| WO | 2009/114375 A2 | 9/2009 |
| WO | 2010/035736 A1 | 3/2010 |
| WO | 2010/087483 A1 | 8/2010 |
| WO | 2010/096359 A1 | 8/2010 |
| WO | 2010/111609 A2 | 9/2010 |
| WO | 2010/129459 A2 | 11/2010 |
| WO | 2011/025908 A1 | 3/2011 |
| WO | 2011/056781 A1 | 5/2011 |
| WO | 2011/109648 A1 | 9/2011 |
| WO | 2012/006736 A2 | 1/2012 |
| WO | 2012/011230 A1 | 1/2012 |
| WO | 2012/027220 A2 | 3/2012 |
| WO | 2012/060277 A1 | 5/2012 |
| WO | 2012/075072 A2 | 6/2012 |
| WO | 2012/108052 A1 | 8/2012 |
| WO | 2012/161317 A1 | 11/2012 |
| WO | 2012/166753 A1 | 12/2012 |
| WO | 20131008344 A1 | 1/2013 |
| WO | 20131016157 A1 | 1/2013 |
| WO | 20131022148 A1 | 2/2013 |
| WO | 2013/030848 A1 | 3/2013 |
| WO | 2013/043173 A1 | 3/2013 |
| WO | 2013/084877 A1 | 6/2013 |
| WO | 2013/084879 A1 | 6/2013 |
| WO | 2013/130718 A1 | 9/2013 |
| WO | 2013/134237 A1 | 9/2013 |
| WO | 2013/138802 A1 | 9/2013 |
| WO | 2013/147694 A1 | 10/2013 |
| WO | 2013/150990 A1 | 10/2013 |
| WO | 2013/153195 A1 | 10/2013 |
| WO | 2014/010490 A1 | 1/2014 |
| WO | 2014/012125 A1 | 1/2014 |
| WO | 2014/028022 A1 | 2/2014 |
| WO | 2014/038326 A1 | 3/2014 |
| WO | 2014/064492 A1 | 4/2014 |
| WO | 2014/079478 A1 | 5/2014 |
| WO | 2014/079570 A1 | 5/2014 |
| WO | 2014/085660 A1 | 6/2014 |
| WO | 2014/085663 A1 | 6/2014 |

(56) References Cited

FOREIGN PATENT DOCUMENTS

| | | |
|---|---|---|
| WO | 2014/111385 A1 | 7/2014 |
| WO | 2014/111794 A1 | 7/2014 |
| WO | 2014/121261 A1 | 8/2014 |
| WO | 2014/148020 A1 | 9/2014 |
| WO | 2014/161535 A2 | 10/2014 |
| WO | 2014/161534 A3 | 11/2014 |
| WO | 2014/205301 A2 | 12/2014 |
| WO | 2015/029286 A1 | 3/2015 |
| WO | 2015/077113 A1 | 5/2015 |
| WO | 2015/094898 A2 | 6/2015 |
| WO | 2015/095088 A1 | 6/2015 |
| WO | 2015/095090 A1 | 6/2015 |
| WO | 2015/095146 A1 | 6/2015 |
| WO | 2015/095151 A2 | 6/2015 |
| WO | 2015100056 A1 | 7/2015 |
| WO | 2015113023 A1 | 7/2015 |
| WO | 2015/127583 A1 | 9/2015 |
| WO | 2015157202 A1 | 10/2015 |
| WO | 2016/005455 A1 | 1/2016 |
| WO | 2016010954 A2 | 1/2016 |
| WO | 2016069821 A1 | 5/2016 |
| WO | 2016089844 A1 | 6/2016 |
| WO | 2016118683 A1 | 7/2016 |
| WO | 2016/154284 A1 | 9/2016 |
| WO | 2016/178966 A1 | 11/2016 |
| WO | 2016176171 A1 | 11/2016 |
| WO | 2016/201027 A2 | 12/2016 |
| WO | 2017038075 A1 | 3/2017 |
| WO | 2017062798 A1 | 4/2017 |
| WO | 2017127489 A1 | 7/2017 |
| WO | 2017210376 A1 | 12/2017 |
| WO | 2018162385 A1 | 9/2018 |

OTHER PUBLICATIONS

Machine Translation of JP-2008094641-A, Apr. 2008 (Year: 2008).*
West et al., Optimisation of photoresist removal from silicon wafers using atmospheriepressure plasma jet effluent, Jul. 2015, 22nd International Symposium on Plasma Chemistry (Year: 2015).*
Pie Scientific, Photoresist stripping and descum organic contamination removal for silicon wafer, Feb. 2016 (Year: 2016).*
Benjamin et al; "The Adhesion of Evaporated Metal Films on Glass"; Proc. Roy. Soc. A., vol. 261, (1962); p. 516-531.
Borghi et al; "M2 Factor of Bessel-Gauss Beams"; Optics Letters; vol. 22, No. 5; (1997) p. 262-264.
Chen et al. "Development of an AOI system for chips with a hole on backside based on a frame imager" Proc. of SPIE vol. 9903, 2016. 6 pgs.
Iijima et al; "Resistivity Reduction by External Oxidation of Cu—Mn Alloy Films for Semiconductor Interconnect Application"; Journal of Vacuum Science & Technology B: Microelectronics and Nanometer Structures Processing, Measurement, and Phenomena, 27, 1963-1968 (2009.
Intergrace, "Borosilicate glass: technical glass by Pulles & Hanique: Duan & Pyrex," Pulles & Hanique B.V., 2 pgs. Published Mar. 15, 2012, retrieved from: https://web.archive.org/web/20120315092729/ http://www.pulleshanique.com/02_borosilicate-glass.htm.
International Search Report and Written Opinion PCT/US2017/ 035346 dated Sep. 7, 2017.
International Search Report and Written Opinion PCT/US2018/ 056240 dated May 13, 2019, 19 Pgs.
Invitation to Pay Additional Fees From the International Searching Authority; PCT/US2018/056240 dated Mar. 14, 2019; 14 Pages; European Patent Office.
Kiyama et al; "Examination of Etching Agent and Etching Mechanism on Femtosecond Laser Microfabrication of Channels Inside Vitreous Silica Substrates"; J. Phys. Chem. C, 2009, 113, p. 11560-11566.
Koike et al; "P-33: Cu—Mn Electrodes for a-Si TFT and Its Electrical Characteristics"; SID Symposium Digest of Technical Papers, 41:1, 1343-1346 (2010.

Koike et al; "Self-Forming Diffusion Barrier Layer in Cu—Mn Alloy Metallization"; Appl. Phys. Lett. 87, 041911-1-041911-3 (2005.
Microchemicals, "Silicon Wafers, Quartz Wafers, Glass Wafers," Product Specifications: Brochure. 2014, 28 pgs.
Ogutu et al; "Superconformal Filling of High Aspect Ratio Through Glass Vias (TGV) for Interposer Applications Using TNBT and NTBC Additives"; Journal of the Electrochemical Society, 162 (9), D457-D464 (2015.
Yun et al; "P-23:The Contact Properties and TFT Structures of A-IGZO TFTs Combined With Cu—Mn Alloy Electrodes"; SID Symposium Digest of Technical Papers 42:1, 1177-1180.
Shorey et al; "Progress and Application of Through Glass Via (TGV) Technology"; 2016 Pan Pacific Microelectronis Symposium, SMTA, Jan. 25, 2016; p. 1-6.
Shorey; "Leveraging Glass for Advanced Packaging and IoT"; Apr. 21, 2016, Retrieved Form the Internet: URL:http://www.corning. com/media/worldwide/cdt/documents/iMAPs%20-%20Corning% 20Overview%20-%204-21-16%20FINALpptx.pdf.
Siegman; "New Development in Laser Resonators"; SPIE, vol. 1227, Optical Resonators (1990) pp. 2-14.
Thiele; "Relation Between Catalytic Activity and Size of Particle"; Industrial and Engineering Chemistry, vol. 31, No. 7; (1939) p. 916-920.
Topper et al; "3-D Thin Film Interposer Based on TGV (Through Glass Vias): An Alternative to Si-Interposer"; IEEE, Electronic Components and Technology Conference; 2010; p. 66-73.
U.S. Appl. No. 62/846,059; Cai et al. "Silicate Glass Compositions Useful for the Efficient Production of Through Glass Vias", filed May 10, 2019, 43 pgs. Listed in ID as 28483.
U.S. Appl. No. 62/846,102; Guo et al. "High Silicate Glass Articles Possessing Through Glass Vias and Methods of Making and Using Thereof", filed May 10, 2019,36 pgs. Listed in ID as 28303.
Wakayama et al. "Small size probe for inner profile measurement of pipes using optical fiber ring beam device" Proc. of SPIE vol. 8563, 2012. 7 pgs.
Wu et al, "A Study on Annealing Mechanisms With Different Manganese Contents in CuMn Alloy"; Journal of Alloys and Compounds, vol. 542, 2012, p. 118-123.
Zavyalov, "3D Hole Inspection Using Lens with High Field Curvature" Measurement Science Review, V. 15, No. 1, 2015. pp. 52-57.
Smedskjaer et al; "Impact of ZnO on the Structure and Properties of Sodium Aluminosilicate Glasses: Comparison With Alkaline Earth Oxides," Journal of Non-Crystalline Solids 381, 58-64 (2013).
Lapczyna et al., "Ultra high repetition rate (133 MHz) laser ablation of aluminum with 1.2-ps pulses"; Applied Physics A 69 [Suppl.], S883-S886, Springer-Verlag (1999); doi: 10.1007/s003399900300.
Levy et al. "Design, fabrication, and characterization of circular Dammann gratings based on grayscale lithography," Opt. Lett vol. 35, No. 6, p. 880-882 (2010).
Li et al. "Thick Polymer cover layers for laser micromachining of fine holes," Applied Physics A, Sep. 2005, vol. 81, Issues 4, pp. 753-758.
Liu X et al. "laser ablation and micromachining with ultrashort laser pulses", IEEE J. Quantum Electronics, 22, 1706-1716, 1997.
Madehow.com, Liquid Crystal Display (LCD), Jan. 29, 2006, https:/fweb.archive.org/web/20060129092154/http://www.madehow. comVolume-1/Liquid-Crystal-Display-LCD.html; pp. 1-6.
Maeda et al. "Optical performance of angle-dependent light-control glass", Proc. SPIE 1536, Optical Materials Technology for Energy Efficiency and Solar Energy Conversion X, 138 (Dec. 1, 1991).
Matsusaka et al. "Micro-machinability of silversodium ion-exchanged glass by UV nanosecond laser," J. Materials Processing Technology 202 (2008) 514-520.
Mbise et al. "Angular selective window coatings: theory and experiments" J. Phys. D: Appl. Phys. 30 2103 (1997).
McGloin et al."Bessel beams: diffraction in a new light" Contemporary Physics, vol. 46 No. 1 (2005) pp. 15-28.
Merola et al. "Characterization of Bessel beams generated by polymeric microaxicons" Meas. Sci. Technol. 23 (2012) 10 pgs.
MicroChemicals, Silicon Wafers Quartz Wafers Glass Wafers, 2014 (no month) (Year: 2014).

(56) References Cited

OTHER PUBLICATIONS

Miranda et al. (Ultraviolet-induced crosslinking of poly(vinyl alcohol) evaluated by principal component analysis of FTIR spectra; Polym Int 50:1068-1072(2001).
Mirkhalaf, M. et al., Overcoming the brittleness of glass through bio-inspiration and micro-achitecture, Nature Communications, 5:3166/ ncomm4166(2014).
Mukhina L.; "Laser Pulse Damage on the Surface of Ion Exchange Treated Glass"; Soviet Journal of Glass Physics and Chemistry; vol. 19; No. 3; p. 269-272; (1993.
Perry et al., "Ultrashort-pulse laser machining of dielectric materials"; Journal of Applied Physics, vol. 85, No. 9, May 1, 1999, American Institute of Physics, pp. 6803-6810.
Perry et al., "Ultrashort-pulse laser machining"; UCRL-ID-132159, Sep. 1998, pp. 1-38.
Perry et al., "Ultrashort-pulse laser machining"; UCRL-JC-132159 Rev 1., Jan. 22, 1999, pp. 1-24.
Polavka et al. "Crosslinking of polymers by the effect of ultraviolet radiation crosslinking of poly(vinyl alcohol) in the presence ofterephthalic aldehyde"; 1980.
Polynkin et al., "Extended filamentation with temporally chirped femtosecond Bessel-Gauss beams in air"; Optics Express, vol. 17, No. 2, Jan. 19, 2009, OSA, pp. 575-584.
Ramil et al. "Micromachining of glass by the third harmonic of nanosecond Nd:YVO4 laser", Applied Surface Science 255 (2009) p. 5557-5560.
Romero et al. "Theory of optimal beam splitting by phase gratings. II. Square and hexagonal gratings" J. Opt. Soc. Am. A/vol. 24 No. 8 (2007) pp. 2296-2312.
Salleo A et al., Machining of transparent materials using IR and UV nanosecond laser pulses, Appl. Physics A 71, 601-608, 2000.
Serafetinides et al., "Polymer ablation by ultra-short pulsed lasers" Proceedings of SPIE vol. 3885 (2000) http://proceedings.spiedigitallibrary.org/.
Serafetinides et al., "Ultra-short pulsed laser ablation of polymers"; Applied Surface Science 180 (2001) 42-56.
Shah et al. "Micromachining with a high repetition rate femtosecond fiber laser", Journal of Laser Micro/Nanoengineering vol. 3 No. 3 (2008) pp. 157-162.
Shealy et al. "Geometric optics-based design of laser beam shapers",Opt. Eng. 42(11), 3123-3138 (2003). doi:10.1117/1.1617311.
Stoian et al. "Spatial and temporal laser pulse design for material processing on ultrafast scales" Applied Physics A (2014) 114, p. 119-127.
Sundaram et al., "Inducing and probing non-thermal transitions in semiconductors using femtosecond laser pulses"; Nature Miracles, vol. 1, Dec. 2002, Nature Publishing Group (2002), pp. 217-224.
Swift Glass, Quartz/Fused Silica, Mar. 2016 (Year: 2016).
Tom Christiansen, Tami Erickson; Standard Operating Procedure: Spin-On-Glass, Surface Level Characterization (2000).
Toytman et al. "Optical breakdown in transparent media with adjustable axial length and location", Optics Express vol. 18 No. 24, 24688-24698 (2010).
Tsai et al "Investigation of underwater laser drilling for brittle substrates," J. Materials Processing technology 209 (2009) 2838-2846.
Uzgiris et al. "Etched Laser Filament Tracks in Glasses and Polymers", (1973) Phys. Rev. A 7, 734-740.
Vanagas et al., "Glass cutting by femtosecond pulsed irradiation"; J. Micro/Nanolith. MEMS MOEMS. 3(2), 358-363 (Apr. 1, 2004); doi: 10.1117/1.1668274.
Varel et al., "Micromachining of quartz with ultrashort laser pulses"; Applied Physics A 65, 367-373, Springer-Verlag (1997).
Velpula et al.. "Ultrafast imaging of free carriers: controlled excitation with chirped ultrafast laser Bessel beams", Proc. of SPIE vol. 8967 896711-1 (2014).
Wang et al, "Investigation on CO2 laser irradiation inducing glass strip peeling for microchannel formation", Biomicrofluidics 6, 012820 (2012).
Wlodarczyk et al. "The Impact of Graphite Coating and Wavelength on Picosecond Laser Machining of Optical Glasses,", 31st ICALEO Program Notes (2012). Paper M#309.
Wu et al. "Optimal orientation of the cutting head for enhancing smoothness movement in three-dimensional laser cutting" (2013) Zhongguo Jiguang/Chinese Journal of Lasers, 40 (1), art. No. 0103005.
Xu et al. "Optimization of 3D laser cutting head orientation based on the minimum energy consumption" (2014) International Journal of Advanced Manufacturing Technology, 74 (9-12), pp. 1283-1291.
Yan et al. "Fiber structure to convert a Gaussian beam to higher-order optical orbital angular momentum modes" Optics Letters vol. 37 No. 16 (2012) pp. 3294-3296.
Zeng et al. "Characteristic analysis of a refractive axicon system for optical trepanning"; Optical Engineering 45(9), 094302 (Sep. 2006), pp. 094302-1-094302-10.
Zhang et al., "Design of diffractive-phase axicon illuminated by a Gaussian-profile beam"; Acta Physica Sinica (overseas edition), vol. 5, No. 5 (May 1996) Chin. Phys. Soc., 1004-423X/96/05050354-11, pp. 354-364.
"EagleEtch" Product Brochure, EuropeTec Usa Inc., pp. 1-8, Aug. 1, 2014.
"Pharos High-power femtosecond laser system" product brochure; Light Conversion, Vilnius, LT; Apr. 18, 2011, pp. 1-2.
"TruMicro 5000" Product Manual, Trumpf Laser GmbH + Co. KG, pp. 1-4, Aug. 2011.
"What is the difference between Ra and RMS?"; Harrison Electropolishing LP; (http://www.harrisonep.com/electropolishingra.html), Accessed Aug. 8, 2016.
Abakians et al."Evaporative Cutting of a Semitransparent Body With a Moving CW Laser", J. Heat Transfer 110(4a), 924-930 (Nov. 1, 1988) (7 pages) doi:10.1115/1.3250594.
Abramov et al., "Laser separation of chemically strengthened glass"; Physics Procedia 5 (2010) 285-290, Elsevier.; doi: 10.1016/j.phpro.2010.08.054.
Ahmed et al. "Display glass cutting by femtosecond laser induced single shot periodic void array" Applied Physics A: Materials Science and Proccessing vol. 93 No. 1 (2008) pp. 189-192.
Arimoto et al., "Imaging properties of axicon in a scanning optical system"; Applied Optics, Nov. 1, 1992, vol. 31, No. 31, pp. 6653-6657.
ASTM standard C770-16, entitled "Standard Test Method for Measurement of Glass Stress-Optical Coefficient,".
Bagchi et al. "Fast ion beams from intense, femtosecond laser irradiated nanostructured surfaces" Applied Physics B 88 (2007) p. 167-173.
Bhuyan et al. "Laser micro- and nanostructuring using femtosecond Bessel beams", Eur. Phys. J. Special Topics 199 (2011) p. 101-110.
Bhuyan et al. "Single shot high aspect ratio bulk nanostructuring of fused silica using chirp-controlled ultrafast laser Bessel beams" Applied Physics Letters 104 (2014) 021107.
Bhuyan et al. "Ultrafast Bessel beams for high aspect ratio taper free micromachining of glass" Proc. Of SPIE vol. 7728 77281V-1.
Bhuyan et al., "Femtosecond non-diffracting Bessel beams and controlled nanoscale ablation" by IEEE (2011).
Bhuyan et al., "High aspect ratio nanochannel machining using single shot femtosecond Bessel beams"; Applied Physics Letters 97, 081102 (2010); doi: 10.1063/1.3479419.
Bhuyan et al., "High aspect ratio taper-free microchannel fabrication using femtosecond Bessel beams"; Optics Express (2010) vol. 18, No. 2, pp. 566-574.
Case Design Guidelines for Apple Devices Release R5 (https://web.archive.org/web/20131006050442/https://developer.apple.com/resources/cases/Case-Design-Guidelines.pdf; archived on Oct. 6, 2013).
Chen et al. "Projection ablation of glass-based single and arrayed microstructures using excimer laser", (2005) Optics and Laser Technology 37, 271-280.
Chiao et al. 9. "Self-trapping of optical beams," Phys. Rev. Lett, vol. 13, Num. 15, p. 479 (1964).
Corning Inc., "Corning(Registered) 1737 AM LCD Glass Substrates Material Information", issued Aug. 2002.

(56) References Cited

OTHER PUBLICATIONS

Corning Inc., "Corning(Registered) Eagle2000 TM AMLCD Glass Substrates Material Information", issued Apr. 2005.
Couairon et al. "Femtosecond filamentation in transparent media" Physics Reports 441 (2007) pp. 47-189.
Courvoisier et al. "Applications of femtosecond Bessel beams to laser ablation" Applied Physics A (2013) 112, p. 29-34.
Courvoisier et al. "Surface nanoprocessing with non-diffracting femtosecond Bessel beams" Optics Letters vol. 34 No. 20, (2009) p. 3163-3165.
Cubeddu et al., "A compact time-resolved reflectance system for dual-wavelength multichannel assessment of tissue absorption and scattering"; Part of the SPIE Conference on Optical Tomography and Spectroscopy of Tissue III, San Jose, CA (Jan. 1999), SPIE vol. 3597, 0277-786X/99, pp. 450-455.
Cubeddu et al., "Compact tissue oximeter based on dual-wavelength multichannel time-resolved reflectance"; Applied Optics, vol. 38, No. 16, Jun. 1, 1999, pp. 3670-3680.
Ding et al., "High-resolution optical coherence tomography over a large depth range with an axicon lens"; Optic Letters, vol. 27, No. 4, pp. 243-245, Feb. 15, 2002, Optical Society of America.
Dong et al. "On-axis irradiance distribution of axicons illuminated by spherical wave", Optics & Laser Technology 39 (2007) 1258-1261.
Duocastella et al. "Bessel and annular beams for material processing", Laser Photonics Rev. 6, 607-621, 2012.
Dumin. "Exact solutions for nondiffracting beams I. The scaler theory" J. Opt. Soc. Am. A. 4(4) pp. 651-654.
Eaton et al. "Heat accumulation effects in femtosecond laser written waveguides with variable repetition rates", Opt. Exp. 5280, vol. 14, No. 23, Jun. 2006.
Gattass et al. "Micromachining of bulk glass with bursts of femtosecond laser pulses at variable repetition rates" Opt. Exp. 5280, vol. 14, No. 23, Jun. 2006.
Girkin et al., "Macroscopic multiphoton biomedical imaging using semiconductor saturable Bragg reflector modelocked Lasers"; Part of the SPIE Conference on Commercial and Biomedical Applications of Ultrafast Lasers, San Jose, CA (Jan. 1999), SPIE vol. 3616, 0277-786X/99, pp. 92-98.
Glezer et al., "Ultrafast-laser driven micro-explosions in transparent materials"; Applied Physics Letters, vol. 71 (1997), pp. 882-884.
Golub, I., "Fresnel axicon"; Optic Letters, vol. 31, No. 12, Jun. 15, 2006, Optical Society of America, pp. 1890-1892.
Gori et al. "Analytical derivation of the optimum triplicator" Optics Communications 157 (1998) pp. 13-16.
Handbook of Adhesives (3rd edition, Edited by Irving Skeist).
Herman et al., "Laser micromachining of 'transparent' fused silica with 1-ps pulses and pulse trains"; Part of the SPIE Conference on Commercial and Biomedical Applications of Ultrafast Lasers, San Jose, CA (Jan. 1999), SPIE vol. 3616, 0277-786X/99, pp. 148-155.
Honda et al. "A Novel Polymer Film that Controls Light Transmission", Progress in Pacific Polymer Science 3, 159-169 (1994).
Hu et al. "5-axis laser cutting interference detection and correction based on STL model" (2009) Zhongguo Jiguang/Chinese Journal of Lasers, 36 (12), pp. 3313-3317.
Huang et al., "Laser etching of glass substrates by 1064 nm laser irradiation", Applied Physics, Oct. 2008, vol. 93, Issue 1, pp. 159-162.
Juodkazis S. et al. Laser induced microexplosion confined in the bulk of a sapphire crystal: evidence of multimegabar pressures., Phys. Rev. Lett. 96, 166101, 2006.
Karlsson et al. "The technology of chemical glass strengthening—a review" Glass Technol: Eur. J. Glass Sci. Technol. A (2010) 51 (2) pp. 41-54.
Kondo et al., Three-Dimensional Microdrilling of Glass by Multiphoton Process and Chemical Etching, 1999, Japanese Journal of Applied Physics, vol. 38, Part 2, No. 10A (Year: 1999).
Kosareva et al., "Formation of extended plasma channels in a condensed medium upon axicon focusing of a femtosecond laser pulse"; Quantum Electronics 35 (11) 1013-1014 (2005), Kvantovaya Elektronika and Turpion Ltd.; doi: 10.1070/QE2005v035n11ABEH013031.
Koyama et al "Laser-micromachining for Ag Ion Exchanged Glasses," Second International Symposium on Laser Precision Microfabrication, Proc. SPE vol. 4426 (2002) 162-165.
Kruger et al. "UV laser drilling of SiC for semiconductor device fabrication," J. Physics:Conference Series 59 (2007) 740-744.
Kruger et al., "Femtosecond-pulse visible laser processing of transparent materials"; Applied Surface Science 96-98 (1996) 430-438.
Kruger et al., "Laser micromachining of barium aluminium borosilicate glass with pluse durations between 20 fs and 3 ps"; Applied Surface Science 127-129 (1998) 892-898.
Kruger et al., "Structuring of dielectric and metallic materials with ultrashort laser pulses between 20 fs and 3 ps"; SPIE vol. 2991, 0277-786X/97, pp. 40-47.

\* cited by examiner

ARTICLES AND METHODS OF FORMING VIAS IN SUBSTRATES

CROSS-REFERENCE TO RELATED APPLICATIONS

This application is a divisional and claims the benefit of priority under 35 U.S.C. § 120 of U.S. patent application Ser. No. 15/609,238, filed on May 31, 2017, which claims the benefit of priority under 35 U.S.C. § 119 of U.S. Provisional Application Ser. No. 62/343,943 filed on Jun. 1, 2016 the content of which is relied upon and incorporated herein by reference in its entirety.

BACKGROUND

Field

The present disclosure generally relates to articles and methods of forming vias in substrates. In particular, the present disclosure is directed to articles and methods of forming through vias in substrates that include etching processes that preserve the surface roughness (Rq) of a substrate.

Technical Background

An interposer may be used as an electrical interface in an electronic device, including devices having a radio frequency (RF) filter, to spread an electrical connection to a wider pitch or to reroute an electrical connection to a different electrical connection. Glass interposers have become an attractive alternative to silicon and fiber reinforced polymers. This is due, in part, to the ability of glass to be formed in large thin sheets. However, with continuously thinner electronic devices, many applications require interposers to the have thicknesses of 300 μm or less. Such thin glass can be difficult to handle in fabrication procedures because of the glass's fragility and lack of stiffness. To counteract a glass substrate's fragility and lack of stiffness, fabrication methods using a carrier to which the glass substrate is bonded have been developed.

Van der Waals forces may be used to temporarily bond glass articles to carriers. The energy of the temporary bond is sufficient to survive flat panel fabrication, while remaining de-bondable. However, Van der Waals forces may produce weak bonds, if any, when the surface roughness (Rq) of the glass article is too high.

Typically, glass interposers require vias (holes) to be filled with electrically conductive material to provide electrical interfacing. A known method of creating vias in glass interposers is by creating a damage region through the thickness of the glass interposer and then submerging to substrate into an etchant. The etchant may then remove material from the damage region to enlarge the hole. However, the etching process is not selective and material may be removed from both faces of the glass interposer as well as enlarging the hole. This invariably creates a glass interposer surface roughness (Rq) outside of the range which Van der Waals bonds can be appropriately formed.

Accordingly, a need exists for methods for forming vias in substrates while preserving low surface roughnesses (Rq) such that the substrates may be removably bonded to carriers.

SUMMARY

In a first aspect, a method of forming a via in a substrate having at least one damage region extending from a first surface includes etching the at least one damage region of the substrate to form a via in the substrate while the first surface of the substrate is masked. The mask is then removed from the first surface of the substrate, and upon removal of the mask the first surface of the substrate has a surface roughness (Rq) of about less than 1.0 nm.

A second aspect according to the first aspect, wherein the mask is selected from a group consisting of diphenylsilicon, phenylsilicon, methylphenylsilicon, and diamond-like carbon (DLC).

A third aspect according to the second aspect, wherein the mask is DLC and the DLC is a hydrogenated amorphous carbon.

A fourth aspect according to any of the preceding aspects, wherein the first surface of the substrate has a surface roughness (Rq) of about less than 0.6 nm upon removal of the mask.

A fifth aspect according to any of the preceding aspects, wherein a second surface of the substrate opposite the first surface of the substrate is masked during etching.

A sixth aspect according to any of the preceding aspect, wherein the mask is removed by oxidation.

A seventh aspect according to any of the preceding aspects, wherein the via is a blind via or a through via.

An eighth aspect according to any of the preceding aspects, wherein the mask is selectively applied to the first surface of the substrate such that the damage region is unmasked.

A ninth aspect according to any of the preceding aspects, wherein the substrate is a glass, ceramic, or glass-ceramic.

A tenth aspect according to any of the preceding aspects, further including removably bonding the substrate to a carrier by disposing the first surface of the substrate on a bonding surface of the carrier.

An eleventh aspect according to the tenth aspect, further including, after removably bonding the substrate to the carrier, processing the substrate by at least one of applying alkaline cleaning solutions to the substrate, wet etching the substrate, polishing the substrate, metal plating the substrate, metal patterning the substrate by wet etching, depositing material onto the substrate, and annealing the substrate.

A twelfth aspect according to the eleventh aspect, further including removing the carrier from the substrate.

A thirteenth aspect according to any one of the tenth through twelfth aspects, wherein the mask is selectively applied to the first surface of the substrate such that the damage region is unmasked.

In a fourteenth aspect, an article includes a substrate including a first surface and a second surface separated by a thickness T. At least one damage region is within the substrate and extends from the first surface. A first film layer is disposed on an undamaged region of the first surface of the substrate. The first film layer is selected from a group consisting of diphenylsilicon, phenylsilicon, methylphenylsilicon, and diamond-like carbon (DLC).

A fifteenth aspect according to the fourteenth aspect, further including a second film layer disposed on the undamaged region of the second surface of the substrate, the second film layer selected from a group consisting of diphenylsilicon, phenylsilicon, methylphenylsilicon, and diamond-like carbon (DLC).

A sixteenth aspect according to the fourteenth or fifteenth aspect, wherein the first film is DLC and the DLC is a hydrogenated amorphous carbon.

In a seventeenth aspect according to any one of the fourteenth through sixteenth aspects, wherein the substrate is glass, ceramic, or glass-ceramic.

Additional features and advantages of the will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and are not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
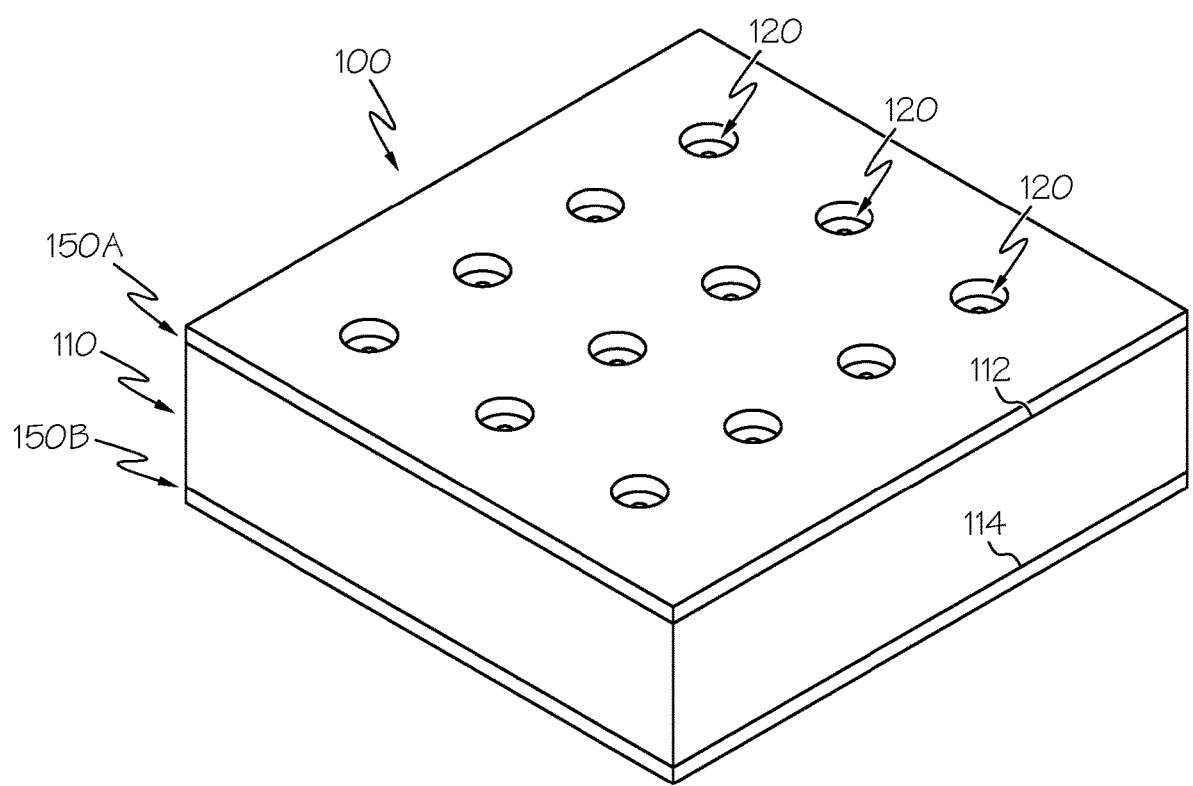
FIG. 1 illustrates a perspective view of an article including a substrate and a mask, according to one or more embodiments shown and described herein.

Referring generally to the figures, embodiments of articles and methods of creating vias in substrates provided herein allow for the preservation of surface roughness (Rq) of substrates so that the substrates may be removably bonded to carriers for further processing. Reference will now be made in detail to various embodiments of articles and methods of forming vias in substrates, examples of which are illustrated in the accompanying drawings. Whenever possible, the same reference numerals will be used throughout the drawings to refer to the same or like parts. It is noted that the embodiments illustrated in the figures are not to scale and that relative sizes and widths were selected for illustrative purposes only.

Embodiments preserve a pre-etch surface roughness of a substrate by utilizing mask layers during etching processes for via formation. By preserving the low surface roughness of the substrate during via formation, the substrate may be removably bonded to a carrier for further processing. After processing, the substrate may be removed from the carrier, such that the carrier may be reused for processing further substrates. Various embodiments of articles and methods for via formation are described in detail below.

FIG. 1 depicts an example article 100. The articles disclosed herein may be used, for example, as an interposer in a semiconductor package, the articles having etched holes (e.g., vias) and surface attributes which allow for successful downstream processing including, but not limited to, via metallization and application of redistribution layers (RDL) for semiconductor devices, radio-frequency (RF) devices (e.g., antennae, switches, and the like), interposer devices, microelectronic devices, optoelectronic devices, microelectronic mechanical system (MEMS) devices and other applications where vias may be leveraged.

Figure 2:
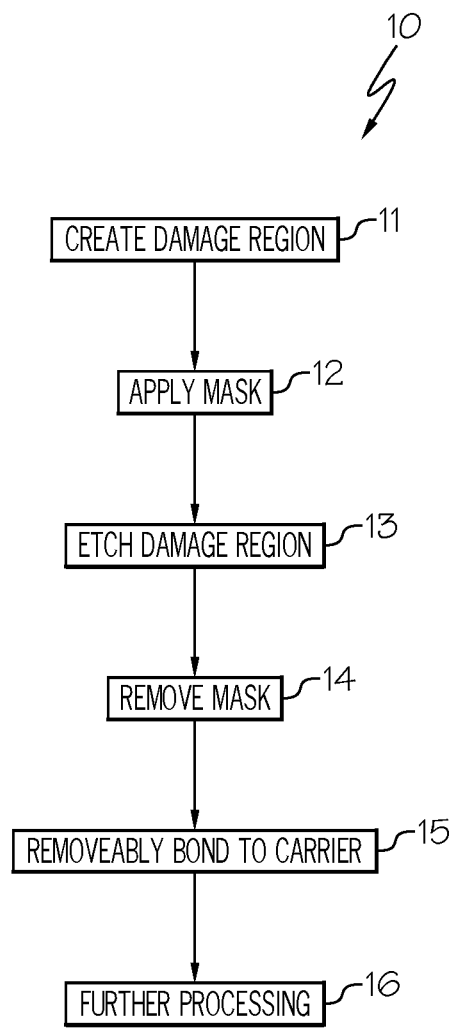
FIG. 2 illustrates a flowchart describing a method of making an article, according to one or more embodiments shown and described herein.

FIG. 2 depicts an exemplary flowchart 10 generally illustrating an example process for forming vias in substrates. The steps depicted in the flowchart will be described in greater detail throughout the description of the various figures. It is noted that though the flowchart 10 is depicted as having a certain order, it should be understood that embodiments of the present disclosure are not limited to the order of steps shown in FIG. 1.

Referring to FIG. 1, the article 100 generally includes a substrate 110. The substrate 110 has first and second surfaces 112, 114. At least one damage region 120 is shown on the first surface 112. First and second masks 150a, 150b are formed on at least one of the first and second surfaces 112, 114 of the substrate 110. In some embodiments, the a mask may only be formed on one of the first or second surface 112,114. In other embodiments, and as shown in FIG. 1, the first and second masks 150a, 150b are formed on both the first and second surfaces 112, 114 of the substrate 110. The substrate 110 may be formed from various glass compositions including, without limitation, borosilicate glasses, aluminosilicate glasses, alkali-aluminosilicate glasses, aluminoborosilicate glasses, alkali-aluminoborosilicate glasses, and soda lime glasses. Furthermore, the substrate 110 may be strengthened (e.g., by an ion exchange process) or non-strengthened. Exemplary substrates may include, but are not limited to, Corning EAGLE XG® glass, chemically strengthened or non-strengthened Corning Gorilla® glass, and Corning Willow® glass. In yet further embodiments, the substrate 110 may be made from other materials such as ceramic and glass ceramic.

Figure 3:
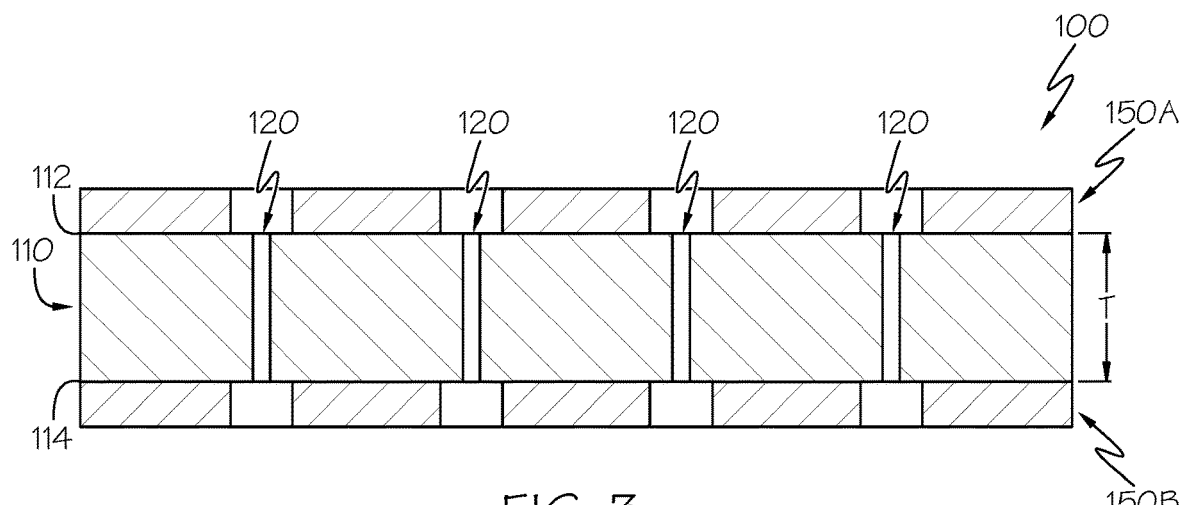
FIG. 3 illustrates a cross-sectional view of the article of FIG. 1 with one or more damage regions formed therein, according to one or more embodiments shown and described herein.

Referring now to FIG. 3, the first and second surfaces 112, 114 of the substrate 110 may be separated by a thickness T, which may depend on the application and is not limited by this disclosure. As non-limiting examples, the thickness T may be in a range of from about 25 µm to about 3,000 µm, about 25 µm to about 2,000 µm, about 25 µm to about 1,000 µm, about 50 µm to about 3,000 µm, about 50 µm to about 2,000 µm, about 50 µm to about 1,000 µm, about 100 µm to about 3,000 µm, about 100 µm to about 2,000 µm, about 100 µm to about 1,000 µm, about 200 µm to about 3,000 µm, about 200 µm to about 2,000 µm, about 200 µm to about 1,000 µm, about 500 µm to about 3,000 µm, about 500 µm to about 2,000 µm, about 500 µm to about 1,000 µm, about 3,000 µm or less, about 2,000 µm or less, about 1,000 µm or less, about 700 µm or less, about 500 µm or less, about 400 µm or less, about 300 µm or less, about 200 µm or less, or about 100 µm or less. The first and second surfaces 112, 114 also have a pre-etch surface roughness (Rq). Surface roughness (Rq) refers to the Root Mean Square (RMS) of a surface's measured microscopic peaks and valleys. The surface roughness (Rq) may be measured using an atomic force microscope (AFM), for example a Veeco Dimension Icon. The surface roughness (Rq) may change in response to processing steps, such as the etching processing described below. This may be more apparent in the examples provided below.

Referring to block 11 of FIG. 2, the at least one damage region 120 is created in the substrate 110. As indicated in FIG. 3, the at least one damage region 120 extends through the thickness T of the substrate 110. The at least one damage region 120 may be a hole extending through the thickness T of the substrate 110. In some embodiments, the at least one damage region 120 does not extend through the entire thickness of the substrate. In some embodiments, there is a combination of damage regions that extend through the thickness T of the substrate with damage regions that do not extend through the entire thickness of the substrate. The at least one damage region 120 may be formed with in the substrate 110 in a variety of ways. In some embodiments, the at least one damage region 120 may be created applying a high energy laser pulse to ablate a narrow hole through the substrate 110. The at least one damage region 120 allows etchant to flow therein during downstream etching processes.

In another example, the at least one damage region 120 may not be a hole through the thickness T of the substrate 110 but rather a line of laser-induced damage formed by a pulsed laser. The pulsed laser may form the damage line by non-linear multi-photon absorption, for example. The rate of material removal within the line of laser-induced damage defining the at least one damage region 120 is faster than the rate of material removal outside of the at least one damage region 120 during the etching process. Exemplary ways for performing the laser damage creation and subsequent etching are disclosed in U.S. Pat. No. 9,278,886 and U.S. Pub. No. 2015/0166395, each of which is hereby incorporated by reference in its entirety.

At block 12 of the flowchart 10 of FIG. 2, first and second masks 150a, 150b may be applied to the first and second surfaces 112, 114 of the substrate 110, respectively. In some embodiments, the first and second masks 150a, 150b are indiscriminately applied to the substrate 110. In such embodiments, the first and second masks 150a, 150b may be applied to the substrate before the at least one damage region 120 is created in the substrate 110, as described above. In such a case, a laser pulse may ablate a hole through the first and second masks 150a, 150b and the substrate 110. In other embodiments, the first and second masks 150a, 150b are indiscriminately applied to the substrate after the at least one damage region has been created. In this instance, the first and second masks 150a, 150b may be selectively removed from the already created at least one damage region 120 prior to further processing. In yet further embodiments, the first and second masks 150a, 150b are selectively applied to the substrate 110. In such embodiments, the first and second masks 150a, 150b may be applied to the substrate 110 so as to avoid the already created at least one damage region 120. As such, the first and second masks 150a, 150b may have openings that are aligned with the at least one damage region 120 to allow etchant to access the at least one damage region 120. The first and second masks 150a, 150b may be applied in thicknesses of less than or equal to 1 μm. In some embodiments, the mask 150a, 150b may be applied in thicknesses of less than or equal to 300 nm. In yet further embodiments, the mask 150a, 150b may be applied in a thickness of about 60 nm.

The first and second masks 150a, 150b may be a variety of materials. For example, and without limitation, the mask may be made from diphenylsilicon, phenylsilicon, methylphenylsilicon, and diamond-like carbon (DLC). In some embodiments, the diamond-like carbon may be hydrogenated amorphous carbon. Such hydrogenated amorphous carbon films may be formed by depositing a hydrocarbon precursor compound such as compounds of formula $C_nH_y$, wherein n is 1 to 6 and y is 2 to 14. In some examples, n is 1 to 4 and y is 2 to 10. The hydrocarbon compounds can be linear or branched. In some examples, the coating layer formed by depositing a hydrocarbon precursor compound has a combined carbon and hydrogen content of at least 80 weight percent, at least 85 weight percent, at least 90 weight percent, or at least 95 weight percent. In some examples, the precursor compound is deposited to form the coating layer has a combined carbon and hydrogen content of at least 80 weight percent, at least 85 weight percent, at least 90 weight percent, at least 95 weight percent, at least 98 weight percent, at least 99 weight percent, or greater than 99.5 weight percent.

Examples of hydrocarbon precursor compounds include alkanes. An alkane can include methane, ethane, propane, butane, pentane and hexane. In some examples, the hydrocarbon precursor compounds include at least one carbon-carbon double bond, for example, an alkene. An alkene can include ethylene, propylene, butylene, pentene and hexane. The carbon-carbon double bond in the alkene can be present at various positions in the compound, for instance, but-1-ene or but-2-ene. In yet other examples, the hydrocarbon precursor compounds includes at least one carbon-carbon triple bond, for example, an alkyne. An alkyne can include ethyne, propyne, butyne, pentyne and hexyne. In some examples, the carbon-carbon triple bond in the alkyne is present at various positions in the compound, for instance, 1-butyne or 2-butyne.

It is contemplated that the first and second masks 150a, 150b may all be the same material. In other embodiments, the first and second masks 150a, 150b may be different materials. In embodiments wherein the mask material is diphenylsilicon, a diphenylsilicon film may be applied to at least one of the first and second surfaces 112, 114 of the substrate 110. Wherein the diphenylsilicon film is applied to both of the first and second surfaces 112, 114 there is a first diphenylsilicon film layer and a second diphenylsilicon film layer. Furthermore, though not shown, the diphenylsilicon film may be applied to edge surfaces of the substrate 110. The film may be applied by vapor deposition, for example. By way of example and not limitation, diphenylsilicon film is formed from diphenylsilane and hydrogen by chemical vapor deposition, preferably plasma enhanced chemical vapor deposition. Diphenylsilicon is a highly effective masking material and is resistant to acid erosion. As such, diphenylsilicon can withstand contact with hydrofluoric-mineral acid mixtures commonly used in etching processes. Furthermore, diphenylsilicon may be readily removed from glass surfaces without creating excessive surface roughness (Rq).

In embodiments, the mask material is hydrogenated amorphous carbon a hydrogenated amorphous carbon film may be applied to at least one of the first and second surfaces 112, 114 of the substrate 110. Wherein the hydrogenated amorphous carbon film is applied to both of the first and second surfaces 112, 114 there is a first hydrogenated amorphous carbon film layer and a second hydrogenated amorphous carbon film layer. The hydrogenated amorphous carbon may be deposited by chemical vapor deposition (CVD) techniques, and like methods. Specific examples of CVD techniques include CVD, low pressure CVD, atmospheric pressure CVD, Plasma Enhanced CVD (PECVD), atmospheric plasma CVD, atomic layer deposition (ALD), plasma ALD, and chemical beam epitaxy. In another example, the coating layer can be deposited by a pyrolytic torch at temperatures above 600° C., above 800° C., or above 1,000° C., including any ranges and subranges therebetween. A gas mixture for forming the coating layer, which contains the hydrocarbon compound, may also comprise a controlled amount of another compound, for example, a carrier gas or working gas. The other compound can include air, oxygen, nitrous oxide, carbon dioxide, water vapor, or hydrogen peroxide, and/or one or more an inert gas, for example, helium, neon, argon, krypton, xenon.

One of the biggest challenges of any selective etching process in which a mask is used is mask removal. The mask material must be tough enough to resist etching, but also must be readily removable without damaging the substrate. Polymer masks, such as photoresist, usually involve soaking the masked substrate in hot solvents with mechanical agitation. Often, inorganic masks are removed by plasma etching. For example, PECVD deposited silicon carbine (SiC) is generally removed with a fluorine containing plasma. However, under such a process, the substrate is also etched during removal, thus increasing the surface roughness (Rq) of the substrate. Diphenylsilicon is unique to traditional masking materials in that it is particularly susceptible to oxidation. During oxidation, the organic groups are pyrolized and removed and the silicon is oxidized to form silicon dioxide. This process allows for the surface roughness of the substrate to be substantially preserved. As shown in Example 3 below, hydrogentated amorphous carbons may also be oxidized to remove the mask. It is contemplated that other plasma polymer films and materials may have substantially similar benefits to diphenylsilicon. For example, and not a limitation, phenylsilicon, methylphenylsilicon, and diamond-like carbon (DLC).

Figure 4:
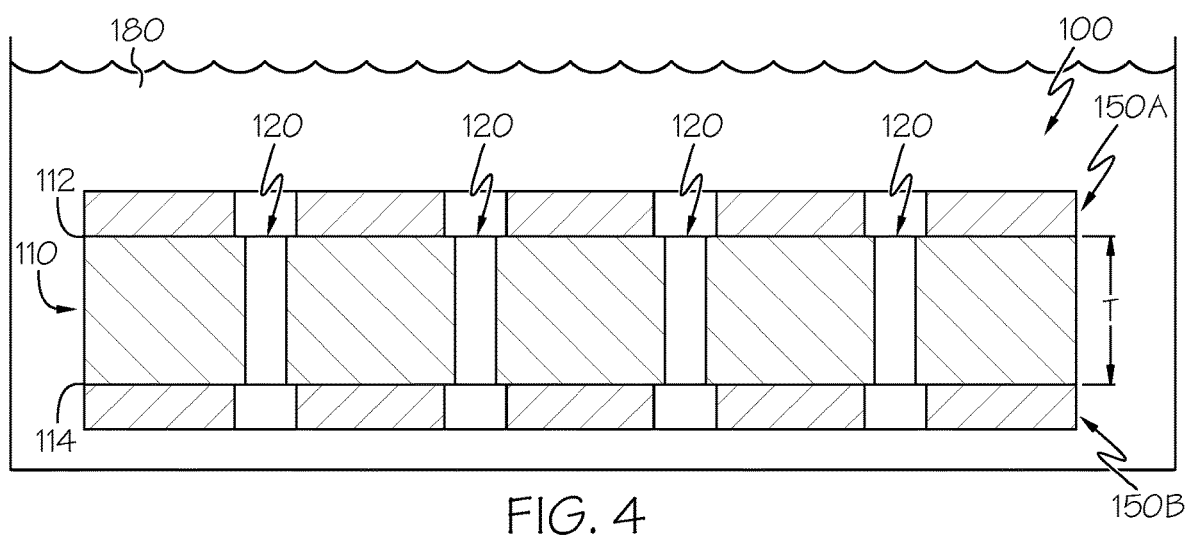
FIG. 4 illustrates the article of FIG. 1 dipped in an etchant, according to one or more embodiments shown and described herein.

Referring to block 13 of the flowchart 10 of FIG. 2, after the at least one damage region 120 has been created and the first and second masks 150*a*, 150*b* have been applied, the glass article 100 may be etched. As shown in FIG. 4, etching processes may include submerging the glass article 100 in an etchant 180 bath. Additionally or alternatively, the etchant 180 may be sprayed onto the glass article 100. The etchant 180 may remove material of the substrate 110 at the unmasked portions of the substrate 110 to enlarge a diameter of the at least one damage region 120. Any suitable etchants may be utilized. Non-limiting examples of etchants include strong mineral acids such as nitric acid, hydrochloric acid, or phosphoric acid with a fluorine containing etchant such as hydrofluoric acid, ammonium bifluoride, sodium fluoride, and the like.

Figure 5:
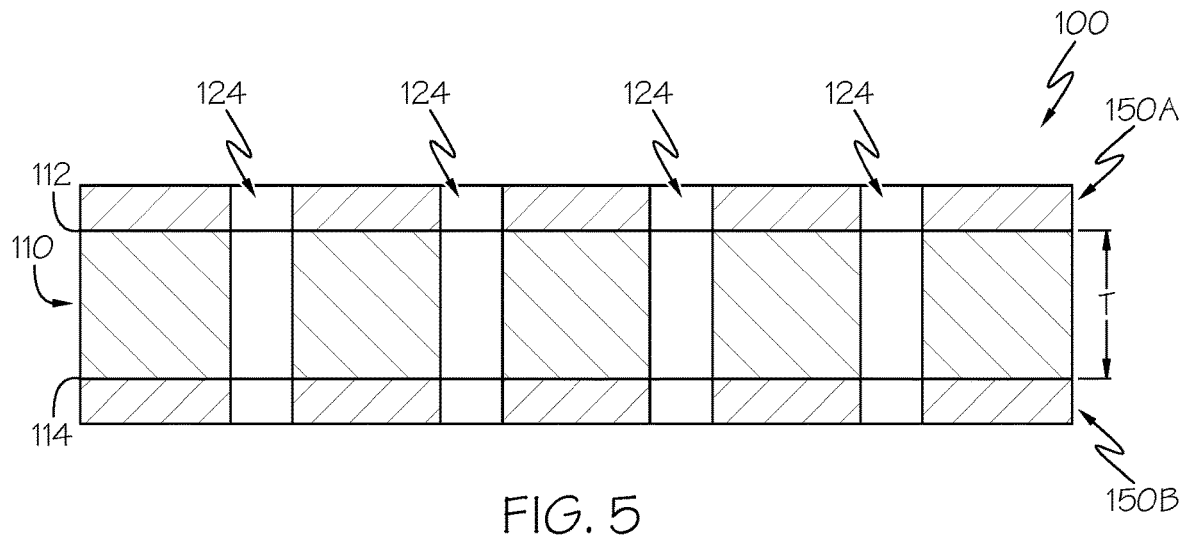
FIG. 5 illustrates a cross-sectional view of the article of FIG. 1 with one or more vias formed therein, according to one or more embodiments shown and described herein.

FIG. 5 illustrates the substrate 110 after etching has occurred. As depicted, a via 124 is opened from the at least one damage region 120 illustrated in FIG. 1. Via 124 is shown a being a through via that extends through the thickness of the substrate. In other embodiments, the via may be a blind via extending only a portion of the way through the substrate. In some embodiments, through vias are formed from damage regions that extend through the thickness of the substrate and the blind vias are formed from damage regions that do not extend through the thickness of the substrate. As an example and not a limitation, the via 124 may have a diameter in a range from about 5 μm to about 150 μm, about 20 μm to about 150 μm, or about 5 μm to about 20 μm. The via may be substantially cylindrical, for example having a waist (point along the via with the smallest diameter) with a diameter that is at least 70%, at least 75%, or at least 80% of the diameter of an opening of the via on the first or second surface.

Figure 6:
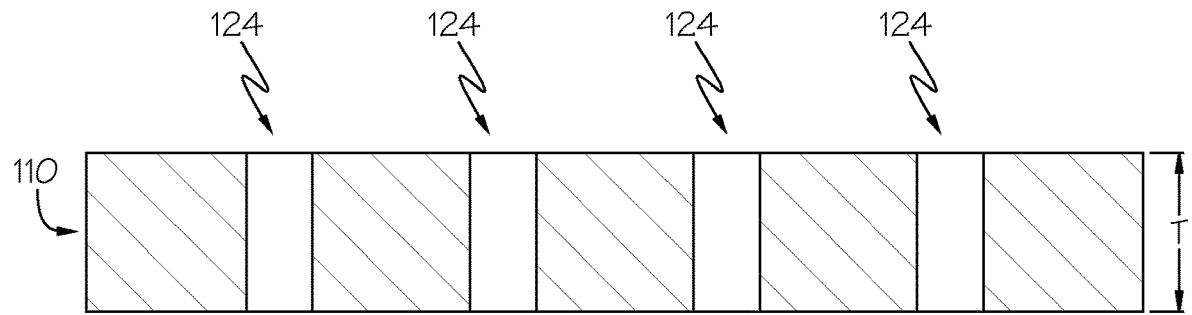
FIG. 6 illustrates a cross-sectional view of the article of FIG. 4 with the mask removed, according to one or more embodiments shown and described herein.

After the at least one via 124 has been opened to a desired diameter, the first and second masks 150*a*, 150*b* may be removed from the substrate 110 (block 14 of FIG. 2). FIG. 6 illustrates the first and second masks 150*a*, 150*b* having been removed from the substrate 110. In some embodiments, the substrate 100 may be cleaned prior to and/or after removing the first and second masks 150*a*, 150*b* (e.g., by rinsing with deionized water). For example and not a limitation, in embodiments wherein diphenylsilicon is the mask material, the first and second masks 150*a*, 150*b* may be removed by oxidation. Example tools for oxidizing diphenylsilicon film includes oxygen photoresist strippers or plasma ashers. The mask 150*a*, 150*b* may be removed without substantially increasing the surface roughness (Rq) of the first and second surfaces 112, 114 of the substrate 110 (i.e., post-etch surface roughness (Rq)). Substantially increasing the surface roughness (Rq) refers to increasing the surface roughness (Rq) of the substrate 110 beyond Van der Waal bonding capability as described herein. In some instances the resulting surface roughness (Rq) of the substrate 110 after removing the mask 150*a*, 150*b* is less than about 1.2 nm, less than about 1.1 nm, less than about 1.0 nm, less than about 0.9 nm, less than about 0.8 nm, less than about 0.7 nm, less than about 0.6 nm, less than about 0.5 nm, less than about 0.4 nm, or less than about 0.3 nm.

Figure 7:
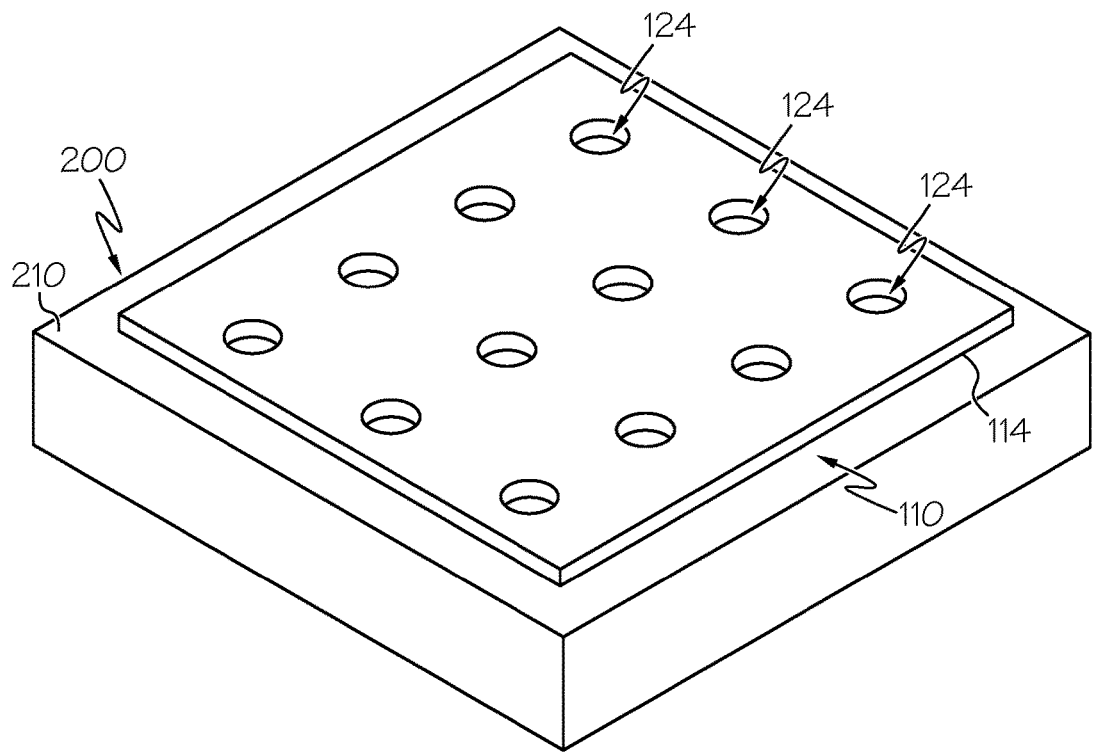
FIG. 7 illustrates a perspective view of the article of FIG. 6 bonded to a carrier, according to one or more embodiments shown and described herein.

After the via 124 has been etched, the substrate 110 may be subjected to additional processing steps for acquiring additional interposer properties. FIG. 7 illustrates an example substrate 110 removably bonded to an example carrier 200 by disposing the second surface 114 of the substrate 110 on a bonding surface 210 of the carrier 200. As discussed above, glass interposers may be very thin (e.g., anywhere from less than 300 μm to 700 μm). Such thin material may be difficult to handle during fabrication procedures because of the fragility and lack of stiffness of the substrate 110. To counteract the fragility and lack of stiffness, the substrate 110 may be removably bonded to the carrier 200 after the vias have been formed and the first and second masks 150*a*, 150*b* have been removed. One exemplary method of removably bonding a substrate 110 to a carrier is by using Van der Waals bonding such as disclosed by U.S. Patent Publication No. 2014/0170378, which is hereby incorporated by reference in its entirety. Van der Waals bonding generally includes disposing a surface of an article on a bonding surface of a carrier and raising a temperature of the article followed by cooling the article to room temperature. The result is the article and the carrier being removably bonded together. Van der Waals bonding is beneficial to downstream processing because of its ability to form bonds that are capable of withstanding processing (e.g., high temperature processing), while allowing the entire area of the substrate to be removed (either all at once, or in sections) from the carrier 200. After the substrate 110 has been removed, the carrier 200 may be reused for processing additional substrates.

However, the challenge of using Van der Waals surface bonding techniques for bonding substrates is that the roughness of the surfaces' being bonded together impacts the ability of the surfaces to be bonded. As a non-limiting example, surface roughness (Rq) greater than about 1.0 nm may substantially prevent spontaneous bonding or result in weak bonding of the substrate 110 to the carrier 200. Weak bonding may permit liquids from one or more processes to infiltrate between the substrate 110 and the carrier 200, thereby leading to de-lamination or to process contamination as residue from one process may impact later processes.

The carrier 200 may be of any suitable material, such as glass, for example. The carrier 200 need not be glass, but instead may be ceramic, glass-ceramic, or metal, for example. If made of glass, the carrier 200 may be of any suitable composition including, but not limited to, aluminosilicate, borosilicate, aluminoborosilicate, soda lime silicate, and may be either alkali containing or alkali-free depending upon its ultimate application. The carrier 200 may have any suitable thickness. Additionally, the carrier 200 may be made of one layer, as shown, or multiple layers (including multiple thin sheets) that are bonded together (e.g., by lamination). Furthermore, the coefficient of thermal expansion of the carrier 200 may be substantially matched with that of the substrate 110 to prevent warping of the substrate 110 or decoupling of the substrate 110 from the carrier 200 during processing at elevated temperatures. The surface roughness (Rq) of the substrate 110 is additive to the surface roughness of the carrier 200. Therefore, it is generally recommended that the carrier 200 have a surface roughness (Rq) less than or equal to 0.6 nm.

Referring to block 16 of FIG. 2, once the substrate 110 is sufficiently bonded to the carrier 200 such that the carrier 200 and the substrate 110 will not separate during processing, the substrate 110 may be subjected to further processing. Processing the substrate 110 may include steps such as applying alkaline cleaning solutions to the substrate 110, wet etching the substrate 110, polishing the substrate 110, metal plating the substrate 110, metal patterning the substrate 110 by wet etching, depositing material onto the substrate 110 by deposition, and annealing the substrate 110.

EXAMPLES

The following Comparative Example and Examples 1 and 2 compare changes in surface roughness (Rq) as a result of acid etching and the removal of diphenylsilicon films. In each example, the glass samples were 0.7 mm thick and did not have damage regions. The surface roughness (Rq) of each sample was measured by a Veeco Dimension ICON AFM with the following parameters: 1 Hz, 512 scans/line, and 2 micron image size.

Comparative Example

In this comparative example, the surface roughness (Rq) of an unmasked Eagle XG® glass sample was measured periodically while the glass sample was etched by a 6M hydrofluoric and 1.6M nitric acid mixture. It was established that surface roughness (Rq) greater than 1 nm is achieved in less than 10 minutes at room temperature with mechanical (non-ultrasonic) agitation. This amount of time corresponded to an etching depth of 40 μm. The results are tabulated in TABLE 1 below. It is noted that surface roughness's (Rq) in some instances of over 1.0 nm may lead to weak or ineffectual Van der Waals bonding.

TABLE 1

| Time | 5 minutes | 10 minutes | 15 minutes |
|---|---|---|---|
| Surface Roughness (Rq) | 1.11 nm | 1.67 nm | 1.46 nm |

Example 1

In this example, the surface roughness (Rq) of an Eagle XG® glass sample was measured before application, after application, and after removal of a diphenylsilicon film. The diphensylsilicon film was deposited in an Applied Materials P5000 Universal Chemical Vapor Deposition (CVD) System with the following parameters: 390° C., volumetric flow rate of 500 sccm diphenylsilicane, volumetric flow rate of 600 sccm Hydrogen ($H_2$), 9 torr, 210 mils. gap, 300 W RF, diphenylsilane bubbler at 80° C. The diphenylsilicon film had a thickness of 60 nm. The diphenylsilicon film was removed by a Gasonics L3510 photoresist stripper having the following parameters: 200° C., 1200 mT, 1000 sccm N2, 100 sccm O2, 900 W, 2.54 GHz, endpoint control with 30 sec. over-etch. The results, tabulated below in TABLE 2, illustrate the surface roughness (Rq) increasing only slightly, while still being well within the range required for Van der Waals bonding as described above. It is noted that the glass substrate was not subjected to acid etching in this example.

TABLE 2

| | Status | | |
|---|---|---|---|
| | Before Application | After Application | After Removal |
| Surface Roughness (Rq) | 0.193 nm | 0.298 nm | 0.272 nm |

Example 2

In this example, the surface roughness (Rq) of an Eagle XG® glass sample was measured after application of the diphenylsilicon film, after 15 minutes of etching, and after removal of a diphenylsilicon film. As in example 1, the diphensylsilicon film was deposited in an Applied Materials P5000 Universal CVD System with the following parameters: 390° C., volumetric flow rate of 500 sccm diphenylsilicane, volumetric flow rate of 600 sccm Hydrogen ($H_2$), 9 torr, 210 mils. gap, 300 W RF, diphenylsilane bubbler at 80° C. The diphenylsilicon film had a thickness of 60 nm. The etchant was a mixture of by a 3M hydrofluoric acid and 1M nitric acid and incorporated mechanical (non-ultrasonic) agitation. As in the above example, the diphenylsilicon film was removed by a Gasonics L3510 photoresist stripper having the following parameters: 200° C., 1200 mT, 1000 sccm N2, 100 sccm O2, 900 W, 2.54 GHz, endpoint control with 30 sec. over-etch. The results, tabulated below in TABLE 3, illustrate the surface roughness (Rq) being well within the range required for Van der Waals bonding as described above. This example also illustrates diphenylsilicon's resistance to acid erosion as discussed herein.

TABLE 3

| | Status | | |
|---|---|---|---|
| | After Application | After 15 Minute Etch | After Removal |
| Surface Roughness (Rq) | 0.269 nm | 0.259 nm | 0.201 nm |

Example 3

In this example, 6 samples of Eagle XG® glass wafers having a 0.7 mm thickness, a diameter of 150 mm and no damage regions had an amorphous hydrogenated carbon film mask applied. The mask was deposited from ethylene and hydrogen in a Nextral NE500 reactive ion etcher under the conditions of 30 sccm ethylene, 70 sccm hydrogen, at a pressure of 60 mT, at a power of 800 W and a frequency of 13.56 MHz. The deposition time and thickness of the mask (as deposited) is listed in Table 4 below. The index of refraction of the mask was also measured (as deposited) at 632 nm. The thickness and index of refraction were measured using a N&K analyzer. After depositing the mask, the samples were etched for approximately 15 minutes at 23° C. in an etching solution of 10 wt % hydroflouric acid and 7 wt % nitric acid. The thickness of the mask and the index of refreaction at 632 nm was measured again after etching using a N&K analyzer and are listed in Table 4 below. The changes in thickness and index were within the range of experimental error. Next the mask was removed by a Gasonics L3510 photoresist stripper having the following parameters: 200° C., 1200 mT, 1000 sccm N2, 100 sccm O2,900 W, 2.54 GHz, endpoint control with 30 sec. over-etch. and the surface roughness (Rq) of each sample was measured by a Veeco Dimension ICON AFM with the following parameters: 1 Hz, 512 scans/line, and 2 micron image size. The results are listed in Table 4 below.

As can be seen in Table 4, Sample 7 did not have a mask and was etched under the same conditions as the six samples with the mask. The surface roughness (Rq) of the unmasked Sample 7 was significantly higher 1.13 compared to 0.240 to 0.278. This demonstrates that the mask

TABLE 4

| Sample | Deposition Time (s) | Thickness (nm) as deposited | Thickness (nm) after etching | Refractive Index at 632 nm as deposited | Refractive Index at 632 nm etching | Rq (nm) After removal |
|---|---|---|---|---|---|---|
| 1 | 30 | 22.86 | 23.78 | 1.809 | 1.791 | 0.278 |
| 2 | 59 | 33.52 | 32.85 | 2.001 | 2.013 | 0.241 |
| 3 | 89 | 46.02 | 46.14 | 2.066 | 2.065 | 0.267 |
| 4 | 160 | 76.93 | 76.63 | 2.119 | 2.119 | 0.257 |
| 5 | 178 | 80.81 | 80.39 | 2.120 | 2.119 | 0.240 |
| 6 | 237 | 110.80 | 110.90 | 2.118 | 2.120 | 0.248 |
| 7 | 0 | 0 | 0 | 0 | 0 | 1.13 |

Other materials provided herein may be deposited on substrates using an Applied Materials P5000 Universal CVD System having similar parameters. For example, phenylsilicon films may deposited from organosilicon hydride precursors with a hydrogen carrier gas in an Applied Materials P5000 Universal CVD system from phenylsilane and hydrogen with the following conditions: 390° C., volumetric flow rate of 120 sccm phenylsilane, and volumetric flow rate of 600 sccm Hydrogen ($H_2$), 9 Torr. pressure, 210 mils. gap, and 300 W 13.56 MHz RF. The phenylsilane ampoule may be at 30° C. The deposition rate may be nearly 1000 nm/min. Methylphenylsilicon films may deposited us a Applied Materials P5000 Universal CVD System with the following process conditions: 390° C., volumetric flow rate of 200 sccm methylphenylsilane, volumetric flow rate of 600 sccm Hydrogen ($H_2$), 9 torr, 210 mils. gap, and 450 W RF. The methylphenylsilane ampoule may be at 80° C. Other precursors such as organosilicon halides would produce similar results.

It should be understood that embodiments described herein provide for forming vias in substrates without substantially increasing the surface roughness (Rq) of the substrate. By preserving the low surface roughness of the substrate during via formation, the substrate may be removably bonded to a carrier for further processing. After processing, the substrate may be removed from the carrier, such that the carrier may be reused for processing further substrates. Furthermore, the through vias may be made substantially cylindrical because they may be etched from both ends.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. An article comprising:
   a substrate comprising a first surface and a second surface separated by a thickness T;
   at least one damage region within the substrate and extending from the first surface; and
   a first film layer disposed on an undamaged region of the first surface of the substrate, the first film layer selected from a group consisting of diphenylsilicon, phenylsilicon, methylphenylsilicon, and diamond-like carbon (DLC),
   wherein the first film layer is configured to be removed via oxidation from the first surface of the substrate without increasing a surface roughness (Rq) of the first surface of the substrate beyond Van der Waal bonding capability with an additional surface.

2. The article of claim 1, wherein the substrate is a glass, ceramic, or glass-ceramic.

3. The article of claim 1, wherein the first film layer is configured to be removed from the first surface of the substrate such that the first surface of the substrate has a surface roughness (Rq) of less than about 1.0 nm upon removal of the first film layer.

4. The article of claim 3, wherein the first film layer is configured to be removed from the first surface of the substrate such that the surface roughness (Rq) of the first surface of the substrate is less than about 0.3 nm.

5. The article of claim 3, wherein the first film layer is configured to be removed from the first surface of the substrate such that the surface roughness (Rq) of the first surface of the substrate is not substantially increased from a surface roughness (Rq) of the first surface of the substrate measured prior to application of the first film layer.

6. The article of claim 5, wherein the first film layer is configured to be removed from the first surface of the substrate such that the surface roughness (Rq) of the first surface of the substrate decreases from a surface roughness (Rq) of the first surface of the substrate measured after application of the first film layer.

7. The article of claim 1, further comprising a second film layer disposed on the undamaged region of the second surface of the substrate, the second film layer selected from a group consisting of diphenylsilicon, phenylsilicon, methylphenylsilicon, and diamond-like carbon (DLC).

8. The article of claim 7, wherein the second film layer is configured to be removed via oxidation from the second surface of the substrate without increasing a surface roughness (Rq) of the second surface of the substrate beyond Van de Waal bonding capability with an additional surface.

9. The article of claim 1, wherein the first film is DLC and the DLC is a hydrogenated amorphous carbon.

* * * * *